(12) United States Patent
Ishii et al.

(10) Patent No.: US 9,176,201 B2
(45) Date of Patent: Nov. 3, 2015

(54) GROUND FAULT DETECTION DEVICE, GROUND FAULT DETECTION METHOD, SOLAR ENERGY SYSTEM, AND GROUND FAULT DETECTION PROGRAM

(75) Inventors: Takafumi Ishii, Tokyo (JP); Taeko Kamegawa, Tokyo (JP); Masanobu Yoshidomi, Nagoya (JP)

(73) Assignee: JX NIPPON OIL & ENERGY CORPORATION, Tokyo (JP)

( * ) Notice: Subject to any disclaimer, the term of this patent is extended or adjusted under 35 U.S.C. 154(b) by 82 days.

(21) Appl. No.: 14/236,462

(22) PCT Filed: Jul. 31, 2012

(86) PCT No.: PCT/JP2012/069454
§ 371 (c)(1),
(2), (4) Date: May 1, 2014

(87) PCT Pub. No.: WO2013/018795
PCT Pub. Date: Feb. 7, 2013

(65) Prior Publication Data
US 2014/0253138 A1 Sep. 11, 2014

(30) Foreign Application Priority Data
Aug. 1, 2011 (JP) ................. 2011-168694

(51) Int. Cl.
*G01R 31/14* (2006.01)
*G01R 31/40* (2014.01)
*H02H 3/16* (2006.01)
*H02M 1/32* (2007.01)
*G01R 31/02* (2006.01)
(Continued)

(52) U.S. Cl.
CPC ............ *G01R 31/405* (2013.01); *G01R 31/025* (2013.01); *H01L 31/02021* (2013.01); *H02H 3/16* (2013.01); *H02M 1/32* (2013.01); *H02S 50/10* (2014.12); *Y02E 10/56* (2013.01)

(58) Field of Classification Search
None
See application file for complete search history.

(56) References Cited

U.S. PATENT DOCUMENTS 6,384,609 B1 5/2002 Kamitani et al.
8,502,416 B2 * 8/2013 Falk ................................. 307/77

FOREIGN PATENT DOCUMENTS

| EP | 2447725 | 5/2012 |
| JP | 07-325121 | 12/1995 |
| JP | 11-218554 | 8/1999 |

(Continued)

OTHER PUBLICATIONS

Search report from E.P.O., mail date is Feb. 25, 2015.
(Continued)

*Primary Examiner* — Minh N Tang
(74) *Attorney, Agent, or Firm* — Greenblum & Bernstein, P.L.C.

(57) ABSTRACT

In a ground fault detection device, two photovoltaic strings are disconnected from a photovoltaic power generation system, measurement for one photovoltaic string is performed by a measuring instrument, and in parallel therewith, the other photovoltaic string before measurement is charged/discharged by a charging/discharging unit by executing various functions of the calculation control unit. In other words, charging/discharging of the photovoltaic string is performed in advance at the same timing as the measurement of the photovoltaic string so that the measurement can be performed immediately after the photovoltaic string is connected to the measuring instrument in a subsequent step.

13 Claims, 22 Drawing Sheets

(51) Int. Cl.
*H01L 31/02* (2006.01)
*H02S 50/10* (2014.01)

(56) References Cited

FOREIGN PATENT DOCUMENTS

| | | |
|---|---|---|
| JP | 2000-081456 | 3/2000 |
| JP | 2003-158282 | 5/2003 |
| JP | 2005-168156 | 6/2005 |
| JP | 2010-80548 | 4/2010 |

OTHER PUBLICATIONS

International Search Report for PCT/JP2012/069454, mail date is Sep. 11, 2012.

* cited by examiner

Fig.5

| | TIME | | | | | | | |
|---|---|---|---|---|---|---|---|---|
| | 1 | 2 | 3 | 4 | 5 | 6 | 7 | 8 |
| First photovoltaic string | Charging/ discharging | Ground fault detection | | | | | | |
| Second photovoltaic string | | Charging/ discharging | Ground fault detection | | | | | |
| Third photovoltaic string | | | Charging/ discharging | Ground fault detection | | | | |
| Fourth photovoltaic string | | | | Charging/ discharging | Ground fault detection | | | |
| Fifth photovoltaic string | | | | | Charging/ discharging | Ground fault detection | | |
| Sixth photovoltaic string | | | | | | Charging/ discharging | Ground fault detection | |
| Seventh photovoltaic string | | | | | | | Charging/ discharging | Ground fault detection |
| Eighth photovoltaic string | Ground fault detection | | | | | | | Charging/ discharging |

Fig.13

| | | | | | | | | | | TIME | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| First photovoltaic string | Positive electrode charging /discharging | Positive electrode measurement | Negative electrode charging /discharging | Negative electrode measurement | | | | | | | | | | | | |
| Second photovoltaic string | | Positive electrode charging /discharging | Positive electrode measurement | Negative electrode charging /discharging | Negative electrode measurement | | | | | | | | | | | |
| Third photovoltaic string | | | Negative electrode charging /discharging | | Positive electrode charging /discharging | Positive electrode measurement | Negative electrode charging /discharging | Negative electrode measurement | | | | | | | | |
| Fourth photovoltaic string | | | | Negative electrode measurement | Negative electrode charging /discharging | Positive electrode charging /discharging | Positive electrode measurement | Negative electrode charging /discharging | | | | | | | | |
| Fifth photovoltaic string | | | | | | Positive electrode measurement | Positive electrode charging /discharging | Negative electrode charging /discharging | Negative electrode measurement | | | | | | | |
| Sixth photovoltaic string | | | | | | | | | Positive electrode charging /discharging | Positive electrode measurement | Negative electrode charging /discharging | Negative electrode measurement | | | | |
| Seventh photovoltaic string | | | | | | | | | | Positive electrode charging /discharging | Positive electrode measurement | Negative electrode charging /discharging | Negative electrode measurement | Positive electrode measurement | Negative electrode charging /discharging | |
| Eighth photovoltaic string | Negative electrode measurement | | | | | | | | | | | | | Positive electrode charging /discharging | Positive electrode measurement | Negative electrode charging /discharging |

Fig. 20

| | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| First photovoltaic string | Positive electrode charging/discharging | Positive electrode measurement | Negative electrode charging/discharging | Negative electrode measurement | | | | | Positive electrode charging/discharging | Positive electrode measurement | Negative electrode charging/discharging | Negative electrode measurement | | | | |
| Second photovoltaic string | | Positive electrode charging/discharging | Positive electrode measurement | Negative electrode charging/discharging | Negative electrode measurement | | | | | Positive electrode charging/discharging | Positive electrode measurement | Negative electrode charging/discharging | Negative electrode measurement | | | |
| Third photovoltaic string | | | Positive electrode charging/discharging | Positive electrode measurement | Negative electrode charging/discharging | Negative electrode measurement | | | | | Positive electrode charging/discharging | Positive electrode measurement | Negative electrode charging/discharging | Negative electrode measurement | | |
| Fourth photovoltaic string | | | | Positive electrode charging/discharging | Positive electrode measurement | Negative electrode charging/discharging | Negative electrode measurement | | | | | Positive electrode charging/discharging | Positive electrode measurement | Negative electrode charging/discharging | Negative electrode measurement | |
| Fifth photovoltaic string | | | | | Positive electrode charging/discharging | Positive electrode measurement | Negative electrode charging/discharging | Negative electrode measurement | | | | | Positive electrode charging/discharging | Positive electrode measurement | Negative electrode charging/discharging | Negative electrode measurement |
| Sixth photovoltaic string | Negative electrode measurement | | | | | Positive electrode charging/discharging | Positive electrode measurement | Negative electrode charging/discharging | Negative electrode measurement | | | | | Positive electrode charging/discharging | Positive electrode measurement | Negative electrode charging/discharging |
| Seventh photovoltaic string | Negative electrode charging/discharging | Negative electrode measurement | | | | | Positive electrode charging/discharging | Positive electrode measurement | Negative electrode charging/discharging | Negative electrode measurement | | | | | Positive electrode charging/discharging | Positive electrode measurement |
| Eighth photovoltaic string | Positive electrode measurement | Negative electrode charging/discharging | Negative electrode measurement | | | | | Positive electrode charging/discharging | Positive electrode measurement | Negative electrode charging/discharging | Negative electrode measurement | | | | | Positive electrode charging/discharging |

TIME

GROUND FAULT DETECTION DEVICE, GROUND FAULT DETECTION METHOD, SOLAR ENERGY SYSTEM, AND GROUND FAULT DETECTION PROGRAM

TECHNICAL FIELD

The present invention relates to a ground fault detection device, a ground fault detection method, a photovoltaic power generation system, and a ground fault detection program.

BACKGROUND ART

In a photovoltaic power generation system which performs power generation using solar light, generally, a plurality of photovoltaic modules are connected in series to constitute a photovoltaic string, and a plurality of photovoltaic strings are connected in parallel to constitute a photovoltaic array. An output from this photovoltaic array is supplied to a load device such as a power conditioner and is supplied to a commercial power system or the like.

In such a photovoltaic power generation system, when there is insulation failure in the photovoltaic array, for example, when a person or an object touches an insulation failure point or when the insulation failure point and a metal stand or the like come in contact, a ground fault at which an electrical circuit comes in contact with the outside in an unintentional form may occur. Conventionally, for example, a ground fault detection device described in Patent Literature 1 is known as a device which detects this ground fault. In the ground fault detection device disclosed in Patent Literature 1, a value of a current flowing from an electrical path of a grounded photovoltaic array to the ground is measured, and the ground fault of the photovoltaic array is detected when this current value exceeds a current setting value, which has been set in advance.

CITATION LIST

Patent Literature

[Patent Literature 1] Japanese Patent Laid-Open Publication No. 2003-158282

SUMMARY OF INVENTION

Technical Problem

However, in the above ground fault detection device, there is concern of the ground fault being erroneously detected due to an influence of a capacitance relative to a ground of a photovoltaic power generation system. Further, it is easily affected by noise generated due to a load device (e.g., noise generated due to a high frequency switch operation or due to a commercial frequency (50 to 60 Hz) or the like) at the time of ground fault detection and therefore there is concern of the ground fault being erroneously detected.

Further, in a recent ground fault detection device, reduction of a time required for detection of a ground fault within a photovoltaic array is greatly required, for example, with the spread and expansion of photovoltaic power generation systems.

Therefore, an object of the present invention is to provide a ground fault detection device, a ground fault detection method, a photovoltaic power generation system, and a ground fault detection program capable of reliably detecting a ground fault and shortening a time required for detection of the ground fault.

Solution to Problem

In order to achieve the above object, a ground fault detection device according to one aspect of the present invention is a ground fault detection device which detects a ground fault within a photovoltaic array in a photovoltaic power generation system including photovoltaic strings configured in such a manner that a plurality of photovoltaic modules are connected in series; the photovoltaic array configured in such a manner that the plurality of photovoltaic strings are connected in parallel; and a load device which consumes or converts power, characterized in that the ground fault detection device includes a switching unit which disconnects two or more photovoltaic strings among the plurality of photovoltaic strings from the photovoltaic power generation system by electrically separating the photovoltaic strings from each other; a measurement unit which connects to each of the plurality of photovoltaic strings to perform a predetermined measurement; a charging/discharging unit which connects to each of the plurality of photovoltaic strings and charges/discharges the photovoltaic string so that its potential relative to the ground is the same as the potential relative to the ground when the photovoltaic string is connected to the measurement unit, and a control unit which performs at least control of operation of the measurement unit and the charging/discharging unit, and the ground fault detection based on a measurement value of the measurement unit, and the control unit causes the measurement unit to perform the predetermined measurement on one photovoltaic string among the two or more photovoltaic strings disconnected by the switching unit, as a measurement target string, and in parallel therewith, causes the charging/discharging unit to charge/discharge the other photovoltaic strings which are separate from the measurement target string and have not yet been subjected to the predetermined measurement among the two or more photovoltaic strings disconnected by the switching unit, as charging/discharging target strings.

In the ground fault detection device of the one aspect, the measurement target string for which the ground fault detection is to be performed is disconnected from the photovoltaic power generation system. Therefore, the capacitance relative to a ground of the measurement target can be reduced, and adverse effects of the capacitance relative to the ground on the ground fault detection can be reduced. Further, the photovoltaic string is electrically separated from the load device at the time of ground fault detection, thereby suppressing adverse effects of noise caused by the load device on the ground fault detection. Therefore, it is possible to reliably detect the ground fault.

Here, generally, the measurement value of the measurement unit may vary due to a capacitance relative to a ground of the photovoltaic string immediately after the photovoltaic string is connected to the measurement unit, and therefore, it is necessary to wait until such a variation settles before performing the measurement. In this regard, in the present invention, the charging/discharging target string before measurement is charged/discharged in parallel with the measurement on the measurement target string among the two or more disconnected photovoltaic strings. In other words, charging/discharging is completed in advance at the same timing as the measurement so that the measurement can be performed immediately after connecting the photovoltaic string to the measurement unit. Thus, the variation of the measurement value can be suppressed and the measurement can be performed without waiting immediately after connecting the measurement unit to the photovoltaic string. Therefore, it is possible to shorten a time required for detection of the ground fault within the photovoltaic array.

Incidentally, "one photovoltaic string" herein refers to any at least one photovoltaic string, and "other photovoltaic string" refers to another (remaining) at least one photovoltaic string. Further, "parallel" herein may refer to, for example, parallel, substantially parallel, simultaneously parallel, simultaneously in parallel, simultaneously, substantially simultaneously, or simultaneous. Specifically, "parallel" refers to there being at least an overlapping time between a period in which measurement is performed and a period in which charging/discharging is performed. The same is assumed hereinafter.

Further, a ground fault detection method according to a first other aspect of the present invention is a ground fault detection method for detecting a ground fault within a photovoltaic array in a photovoltaic power generation system including photovoltaic strings configured in such a manner that a plurality of photovoltaic modules are connected in series; the photovoltaic array configured in such a manner that the plurality of photovoltaic strings are connected in parallel; and a load device which consumes or converts power, characterized in that the ground fault method includes a disconnection step of disconnecting two or more photovoltaic strings among the plurality of photovoltaic strings from the photovoltaic power generation system by electrically separating the photovoltaic strings from each other; a measurement step of connecting a measurement unit to each of the plurality of photovoltaic strings to perform a predetermined measurement; a charging/discharging step of connecting to and charging/discharging each of the plurality of photovoltaic strings so that its potential relative to the ground is the same as the potential relative to the ground when the photovoltaic string is connected to the measurement unit; and a ground fault detection step of determining whether there is a ground fault based on a measurement value obtained in the measurement step, the measurement step includes performing the predetermined measurement on one photovoltaic string among the two or more photovoltaic strings disconnected in the disconnection step, as a measurement target string, and the charging/discharging step includes charging/discharging the other photovoltaic strings which are separate from the measurement target string and have not yet been subjected to the predetermined measurement among the two or more photovoltaic strings disconnected in the disconnection step, as charging/discharging target strings, in parallel with the measurement of the measurement target string in the measurement step.

Further, the photovoltaic power generation system according to a second other aspect of the present invention is characterized in that it includes photovoltaic strings configured in such a manner that a plurality of photovoltaic modules are connected in series; a photovoltaic array configured in such a manner that the plurality of photovoltaic strings are connected in parallel; a load device which consumes or converts power; and the ground fault detection device.

Further, a ground fault detection program according to a third other aspect of the present invention is a ground fault detection program for detecting a ground fault within a photovoltaic array in a photovoltaic power generation system including photovoltaic strings configured in such a manner that a plurality of photovoltaic modules are connected in series; the photovoltaic array configured in such a manner that the plurality of photovoltaic strings are connected in parallel; and a load device which consumes or converts power, characterized in that the ground fault detection program causes a computer to execute a disconnection function for disconnecting two or more photovoltaic strings among the plurality of photovoltaic strings from the photovoltaic power generation system by electrically separating the photovoltaic strings from each other; a measurement function for connecting a measurement unit to each of the plurality of photovoltaic strings to perform a predetermined measurement; a charging/discharging function for connecting a charging/discharging unit to each of the plurality of photovoltaic strings and charging/discharging the photovoltaic string so that its potential relative to the ground is the same as the potential relative to the ground when the photovoltaic string is connected to the measurement unit, and a ground fault detection function for determining whether there is a ground fault based on a measurement value obtained through the measurement function, the measurement function includes performing the predetermined measurement on one photovoltaic string among the two or more photovoltaic strings disconnected through the disconnection function, as a measurement target string, and the charging/discharging function includes charging/discharging the other photovoltaic strings which are separate from the measurement target string and have not yet been subjected to the predetermined measurement among the two or more photovoltaic strings disconnected through the disconnection function, as charging/discharging target strings, in parallel with the measurement of the measurement target string through the measurement function.

The photovoltaic string in which the ground fault is to be detected can be disconnected from the photovoltaic power generation system in the ground fault detection method, the photovoltaic power generation system and the ground fault detection program according to the other aspects as well. Further, the charging/discharging target string before measurement can be charged/discharged in advance, in parallel with the measurement of the disconnected measurement target string. Thus, the action effects described above, i.e., action effects of reliably detecting the ground fault and shortening a time required for detection of the ground fault, are achieved.

Advantageous Effects of Invention

According to the present invention, it is possible to reliably detect the ground fault and to shorten a time required for detection of the ground fault.

BRIEF DESCRIPTION OF DRAWINGS

FIG. 5 is a diagram illustrating an operation scheme of each photovoltaic string in the ground fault detection device of FIG. 1.

FIG. 13 is a diagram illustrating an operation scheme of each photovoltaic string in the ground fault detection device of FIG. 9.

FIG. 20 is a diagram illustrating an operation scheme of each photovoltaic string in the ground fault detection device of FIG. 16.

DESCRIPTION OF EMBODIMENTS

Figure 1:
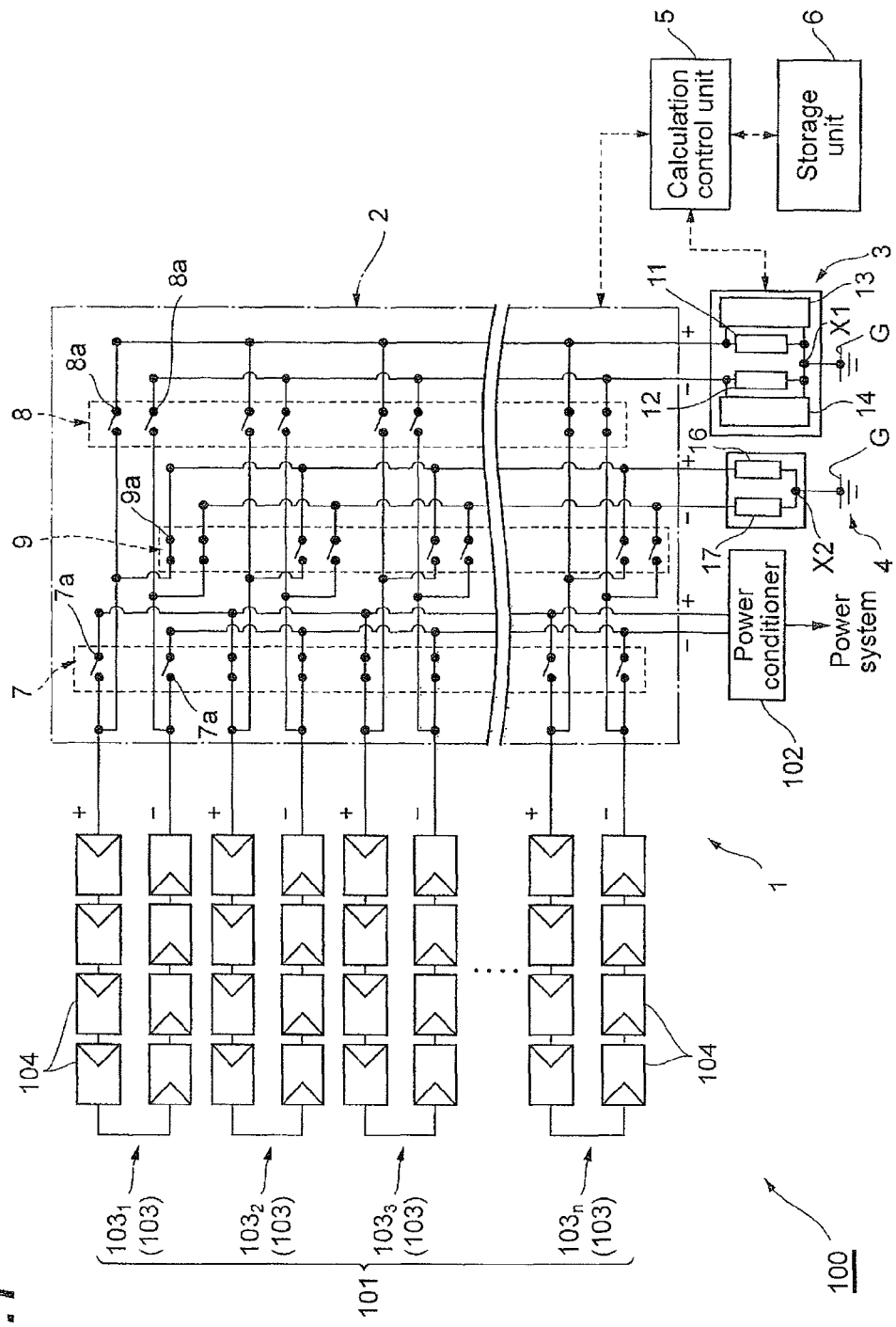
FIG. 1 is a schematic configuration diagram illustrating a state of a photovoltaic power generation system including a ground fault detection device according to a first embodiment.

Hereinafter, preferred embodiments of the present invention will be described in detail with reference to the drawings. Further, in the following description, the same or similar components are denoted with the same reference numerals, and a repeated description is omitted.

First Embodiment

Figure 2:
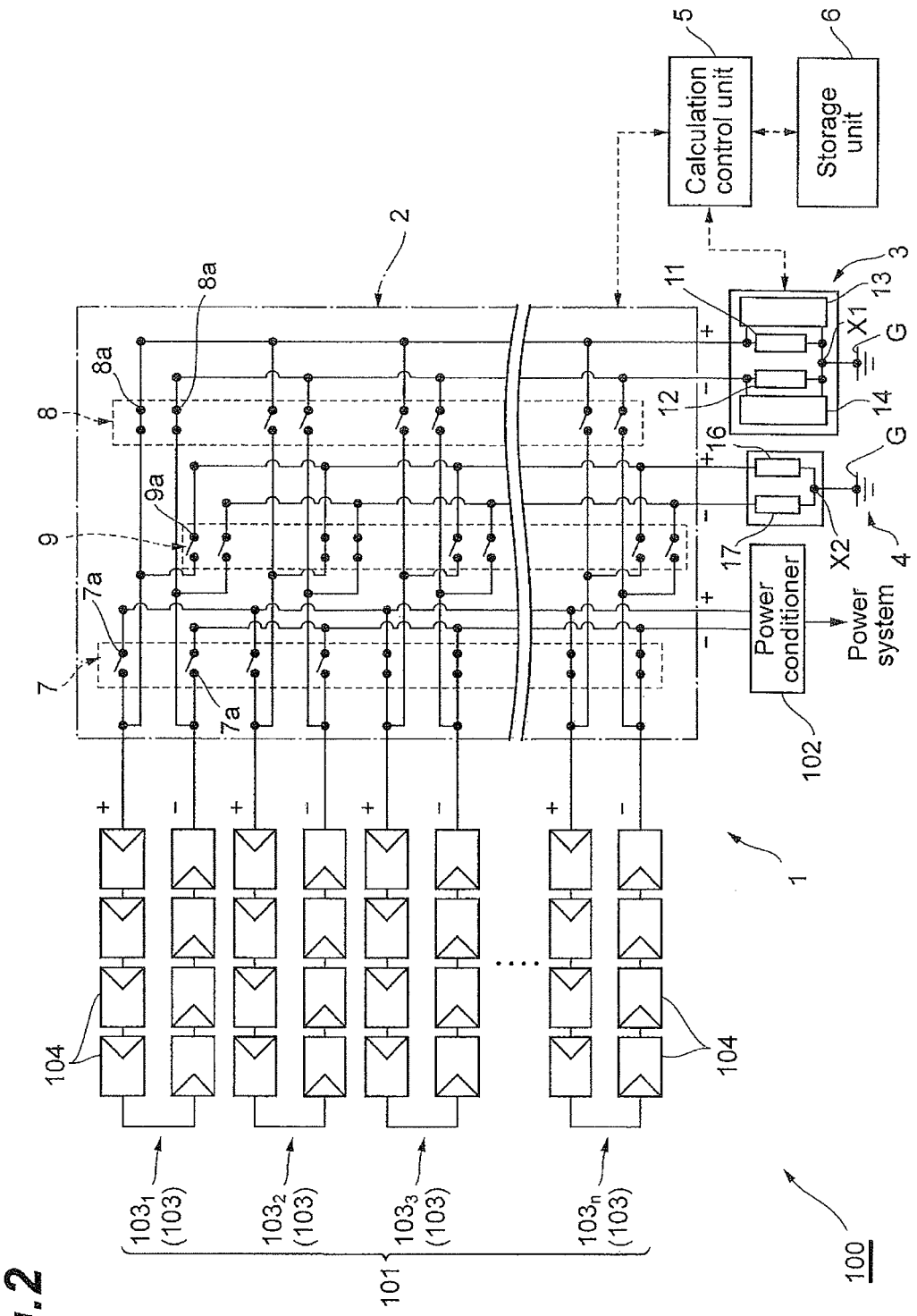
FIG. 2 is a schematic configuration diagram illustrating another state in the photovoltaic power generation system of FIG. 1.
Figure 3:
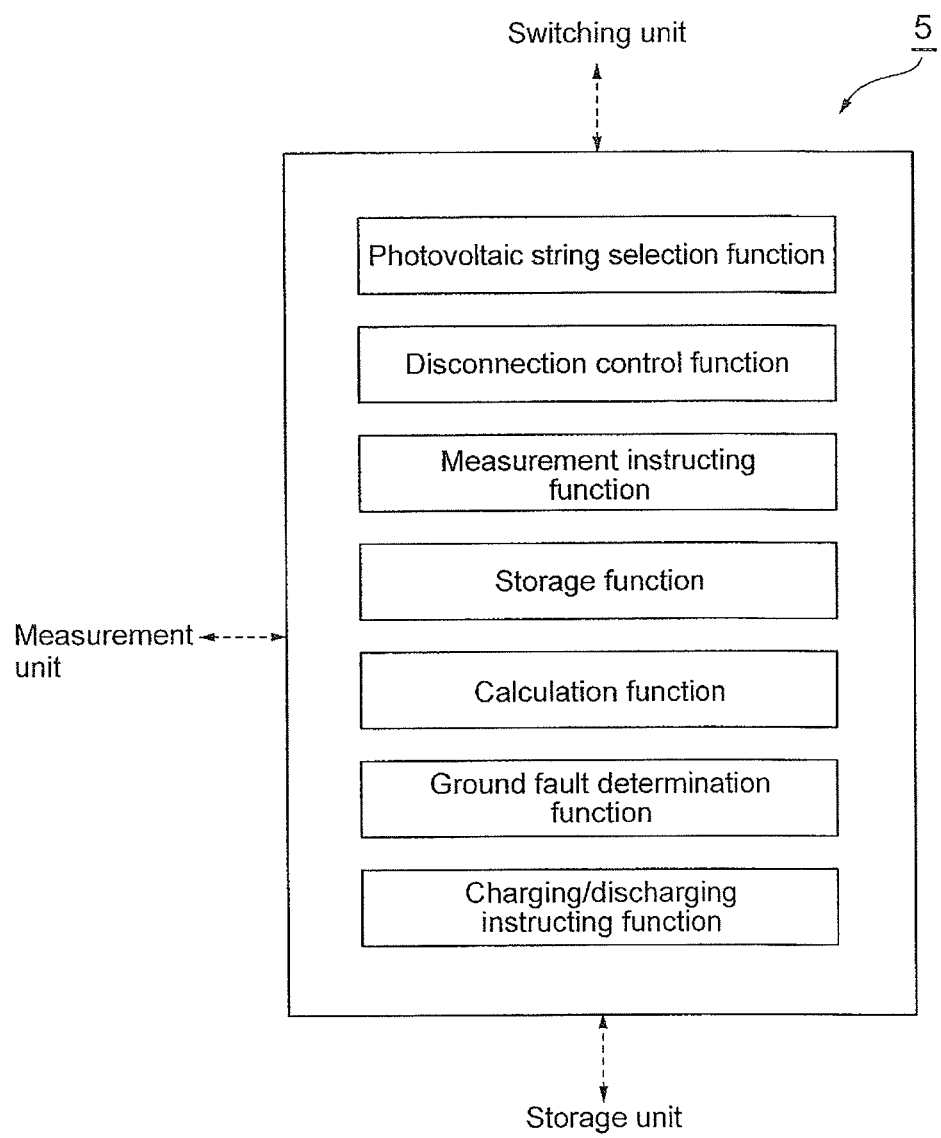
FIG. 3 is a functional block diagram illustrating a calculation control unit of the ground fault detection device of FIG. 1.

A first embodiment of the present invention will be described. FIGS. 1 and 2 are schematic configuration diagrams illustrating a photovoltaic power generation system including a ground fault detection device according to the first embodiment. FIG. 3 is a functional block diagram illustrating a calculation control unit of the ground fault detection device illustrated in FIG. 1. The ground fault detection device 1 detects a ground fault within a photovoltaic array 101 in the photovoltaic power generation system 100, as illustrated in FIGS. 1 and 2. Therefore, this photovoltaic power generation system 100 will first be described.

The photovoltaic power generation system 100 is a power generation system which performs power generation using solar energy, and includes the photovoltaic array 101, and a power conditioner (a load device) 102. The photovoltaic array 101 converts solar energy into electrical energy and supplies the electrical energy to the power conditioner 102 as direct current output. The photovoltaic array 101 has a configuration in which a plurality of photovoltaic strings 103 are connected in parallel. In other words, in the photovoltaic array 101, first to $n^{th}$ photovoltaic strings $103_1$ to $103_n$ are connected in parallel (n is an integer equal to or more than 2).

Each of a plurality of photovoltaic strings 103 has a configuration in which a plurality of (here, 8) photovoltaic modules 104 are connected in series. The plurality of photovoltaic strings 103 are connected to the power conditioner 102 through a switching unit 2 of the ground fault detection device 1.

The power conditioner 102 converts the direct current output supplied from the photovoltaic array 101 into an alternating current output and supplies this alternating current output to a power system (e.g., a commercial power system) of a subsequent stage. This power conditioner 102 has an operation voltage control function for controlling an operation voltage of the photovoltaic array 101 so that a maximum output of the photovoltaic array 101 can be obtained, and a system protection function such as safely stopping the system when abnormality of the power system is detected. Further, the power conditioner 102 may be a transformer insulation type having an isolation transformer or may be a transformerless (non-insulation) type.

The ground fault detection device 1 of this embodiment includes the switching unit 2, a measuring instrument (measurement unit) 3, a charging/discharging unit 4, a calculation control unit (control unit) 5, and a storage unit 6. The switching unit 2 is a unit which performs opening/closing of an electrical circuit. The switching unit 2 disconnects two or more (here, two) photovoltaic strings 103 from the photovoltaic power generation system 100 at the same time, and connects m (here, one) photovoltaic strings 103 in the disconnected state as measurement target strings to the measuring instrument 3. In parallel therewith, the switching unit 2 connects m photovoltaic strings 103 which are in a disconnected state, are separate from the measurement target strings, and have not yet been measured by the measuring instrument 3 as charging/discharging target strings to the charging/discharging unit 4.

This switching unit 2 includes a disconnection switch (switching unit) 7 for disconnecting each photovoltaic string 103 from the photovoltaic power generation system 100, a measurement switch 8 for connecting the disconnected photovoltaic string 103 to the measuring instrument 3, and a charging/discharging switch 9 for connecting the disconnected photovoltaic string 103 to the charging/discharging unit 4. Within this switching unit 2, positive electrodes and negative electrodes of the respective photovoltaic strings 103 are collected to form a positive electrode bus and a negative electrode bus connected in parallel.

The disconnection switch 7 is located between the photovoltaic string 103 and the power conditioner 102 and switches electrical connection/non-connection therebetween. The disconnection switch 7 includes a plurality of disconnection switch elements 7a connected in series with the positive electrodes and the negative electrodes of the respective photovoltaic strings 103. The disconnection switch element 7a is connected to the calculation control unit 5, and switches ON/OFF according to an instruction signal from the calculation control unit 5. The disconnection switch element 7a herein is usually in an on state to enter an electrical connection state, but is turned off at the time of a predetermined measurement and charging/discharging necessary for ground fault detection to enter an electrical blocking state.

Further, terminals on the power conditioner 102 side of the plurality of disconnection switch elements 7a are connected in such a manner that the positive electrodes are connected to one another and the negative electrodes are connected to one another to thereby form a positive electrode bus and a negative electrode bus. The positive electrode bus and the negative electrode bus are connected to the power conditioner 102. A semiconductor switch such as an FET (Field Effect Transistor) or a mechanical switch such as a relay switch may be used as the disconnection switch element 7a.

In the disconnection switch 7 configured in this way, the two sets of disconnection switch elements 7a and 7a connected to the positive electrodes and the negative electrodes of two photovoltaic strings 103 are sequentially turned off. Accordingly, the two photovoltaic strings 103 are electrically sequentially separated and disconnected from the photovoltaic power generation system 100 (enter a disconnected state).

The measurement switch 8 is located between the photovoltaic string 103 and the measuring instrument 3 and switches electrical connection/non-connection therebetween. This measurement switch 8 includes a plurality of measurement switch elements 8a connected in series with the positive electrodes and the negative electrodes of the photovoltaic strings 103. The measurement switch element 8a is connected to the calculation control unit 5, and performs ON/OFF switching according to an instruction signal from the calculation control unit 5. The measurement switch element 8a herein is usually turned off to enter an electrical blocking state, but is turned on at the time of a predetermined measurement necessary for ground fault detection to enter an electrical connection state.

Further, terminals on the measuring instrument 3 side of the plurality of measurement switch elements 8a are connected in such a manner that the positive electrodes are connected to one another and the negative electrodes are connected to one another to thereby form a positive electrode bus and a negative electrode bus. The positive electrode bus and the negative electrode bus are connected to the measuring instrument 3. A semiconductor switch such as an FET or a mechanical switch such as a relay switch may be used as the measurement switch element 8a.

In the measurement switch 8 configured in this way, when two or more photovoltaic strings 103 are disconnected from the photovoltaic power generation system 100 by the disconnection switches 7, one set of the measurement switch elements 8a and 8a connected to the positive electrodes and the negative electrodes in m of the photovoltaic strings 103 is turned on. Accordingly, the photovoltaic strings 103 are measurable by the measuring instrument 3.

The charging/discharging switch 9 is located between the photovoltaic string 103 and the charging/discharging unit 4, and switches electrical connection/non-connection therebetween. This charging/discharging switch 9 includes a plurality of charging/discharging switch elements 9a connected in series with the positive electrodes and the negative electrodes of the photovoltaic strings 103. The charging/discharging switch element 9a is connected to the calculation control unit 5, and performs ON/OFF switching according to an instruction signal from the calculation control unit 5. The charging/discharging switch element 9a herein is usually turned off to enter an electrical blocking state, but is turned on at the time of charging/discharging to enter an electrical connection state.

Further, terminals on the charging/discharging unit 4 side of the plurality of charging/discharging switch elements 9a are connected in such a manner that the positive electrodes are connected to one another and the negative electrodes are connected to one another to thereby form a positive electrode bus and a negative electrode bus. The positive electrode bus and the negative electrode bus are connected to the charging/discharging unit 4. A semiconductor switch such as an FET or a mechanical switch such as a relay switch may be used as the charging/discharging switch element 9a.

In the charging/discharging switch 9 configured in this way, when two photovoltaic strings 103 are disconnected from the photovoltaic power generation system 100 by the disconnection switch 7, a set of charging/discharging switch elements 9a and 9a connected to the positive electrodes and the negative electrodes in m photovoltaic strings 103 not electrically connected to the measuring instrument 3 among the photovoltaic strings 103 is turned on. Accordingly, the photovoltaic strings 103 are chargeable/dischargeable by the charging/discharging unit 4.

The measuring instrument 3 performs a predetermined measurement for ground fault detection on the disconnected photovoltaic string 103. The measuring instrument 3 includes first and second detection resistors 11 and 12 having one sides connected to each other through a connection point (connection unit) X1, a first voltmeter 13 which measures a voltage value V11 generated in the first detection resistor 11, and a second voltmeter 14 which measures a voltage value V12 generated in the second detection resistor 12.

The connection point X1 of the first and second detection resistors 11 and 12 is connected to a ground potential G. The other side (a side opposite to the connection point X1) of the first detection resistor 11 is electrically connectable to the positive electrode bus of the photovoltaic string 103 through the measurement switch 8. The other side (a side opposite to the connection point X1) of the second detection resistor 12 is electrically connectable to the negative electrode bus of the photovoltaic string 103 through the measurement switch 8.

Resistance values of the first and second detection resistors 11 and 12 are equal to or more than a predetermined lower limit value from the viewpoint of safety when the ground fault occurs and are equal to or less than a predetermined upper limit value from the viewpoint of ease of detecting a measurement value (here, voltage values V11 and V12) so that an overcurrent does not flow at the time of measurement. For this resistance value, the same applies to the following resistance.

The first voltmeter 13 is connected between the switching unit 2 and the first detection resistor 11 and between the first detection resistor 11 and the connection point X1. Further, the first voltmeter 13 is connected to the calculation control unit 5, performs measurement of the voltage value V11 according to an instruction signal from the calculation control unit 5, and stores a result of the measurement in the storage unit 6. The second voltmeter 14 is connected between the switching unit 2 and the second detection resistor 12 and between the second detection resistor 12 and the connection point X1. This second voltmeter 14 is connected to the calculation control unit 5, performs measurement of the voltage value V12 according to an instruction signal from the calculation control unit 5, and stores a result of the measurement in the storage unit 6.

The charging/discharging unit 4 connects to the disconnected photovoltaic string 103 so that its potential relative to the ground is the same as a potential relative to the ground when the photovoltaic string is connected to the measuring instrument 3. In this state, the charging/discharging unit 4 performs charging/discharging (charging or discharging) so that a charge amount in a capacitance relative to the ground of the photovoltaic string 103 is the same as a charge amount in a capacitance relative to the ground when the photovoltaic string is connected to the measuring instrument 3. Accordingly, the potential relative to the ground of the photovoltaic string 103 becomes a value equal to the potential relative to the ground converged on a stable value when the photovoltaic string is connected to the measuring instrument 3. The charging/discharging unit 4 includes first and second charging/discharging resistors 16 and 17 having one sides connected to each other through a connection point (connection unit) X2.

The connection point X2 of the first and second charging/discharging resistors 16 and 17 is connected to the ground potential G. The other side (a side opposite to the connection point X2) of the first charging/discharging resistor 16 is electrically connectable to the positive electrode bus of the photovoltaic string 103 through the charging/discharging switch 9. The other side (a side opposite to the connection point X2) of the second charging/discharging resistor 17 is electrically connectable to the negative electrode bus of the photovoltaic string 103 through the charging/discharging switch 9. Resistance values of the first and second charging/discharging resistors 16 and 17 are set to be the same as those of the first and second detection resistors 11 and 12 in the measuring instrument 3.

The calculation control unit 5 is a unit (computer) for controlling the entire ground fault detection device 1. The calculation control unit 5 herein executes a ground fault detection program, which will be described below, to control charging/discharging of the charging/discharging unit 4 and control measurement of the measuring instrument 3, storage and calculation based on a measurement result, and a determination of whether there is a ground fault. This calculation control unit 5 is connected to the switching unit 2, the measuring instrument 3 and the storage unit 6. The calculation control unit 5 may include a CPU (Central Processing Unit) or may include an analog IC circuit or a PLD (Programmable Logic Device) circuit.

This calculation control unit 5 has a string selection function for selecting the photovoltaic string 103 to be disconnected from the photovoltaic power generation system 100, a disconnection control function for controlling disconnection of the photovoltaic string 103 by instructing the disconnection switch 7 of the switching unit 2 to perform ON/OFF switching, a measurement instructing function for instructing the measurement switch 8 of the switching unit 2 to perform ON/OFF switching and instructing the voltmeters 13 and 14 to perform a measurement, a storage function for storing a measurement situation of each photovoltaic string 103, and a measurement result and a calculation result of the voltmeters 13 and 14 in the storage unit 6, a calculation function for performing calculation based on the measurement result stored in the storage unit 6, a ground fault determination function for determining whether there is a ground fault, and a charging/discharging instructing function for instructing performing of charging/discharging of the photovoltaic string 103 by instructing the charging/discharging switch 9 of the switching unit 2 to perform ON/OFF switching, as illustrated in FIG. 3.

The storage unit 6 is a recording medium for storing the ground fault detection program to be executed by the calculation control unit 5, the measurement result of the measuring instrument 3, and the calculation result of the calculation control unit 5. Further, a semiconductor memory, a magnetic storage device or the like may be used as the storage unit 6. Further, when all or a part of the ground fault detection program is not stored in the storage unit 6, all or a part of the ground fault detection program may be stored in an external storage device (e.g., a hard disk) and read to cause the calculation control unit 5 to execute a process according to ground fault detection.

Figure 4:
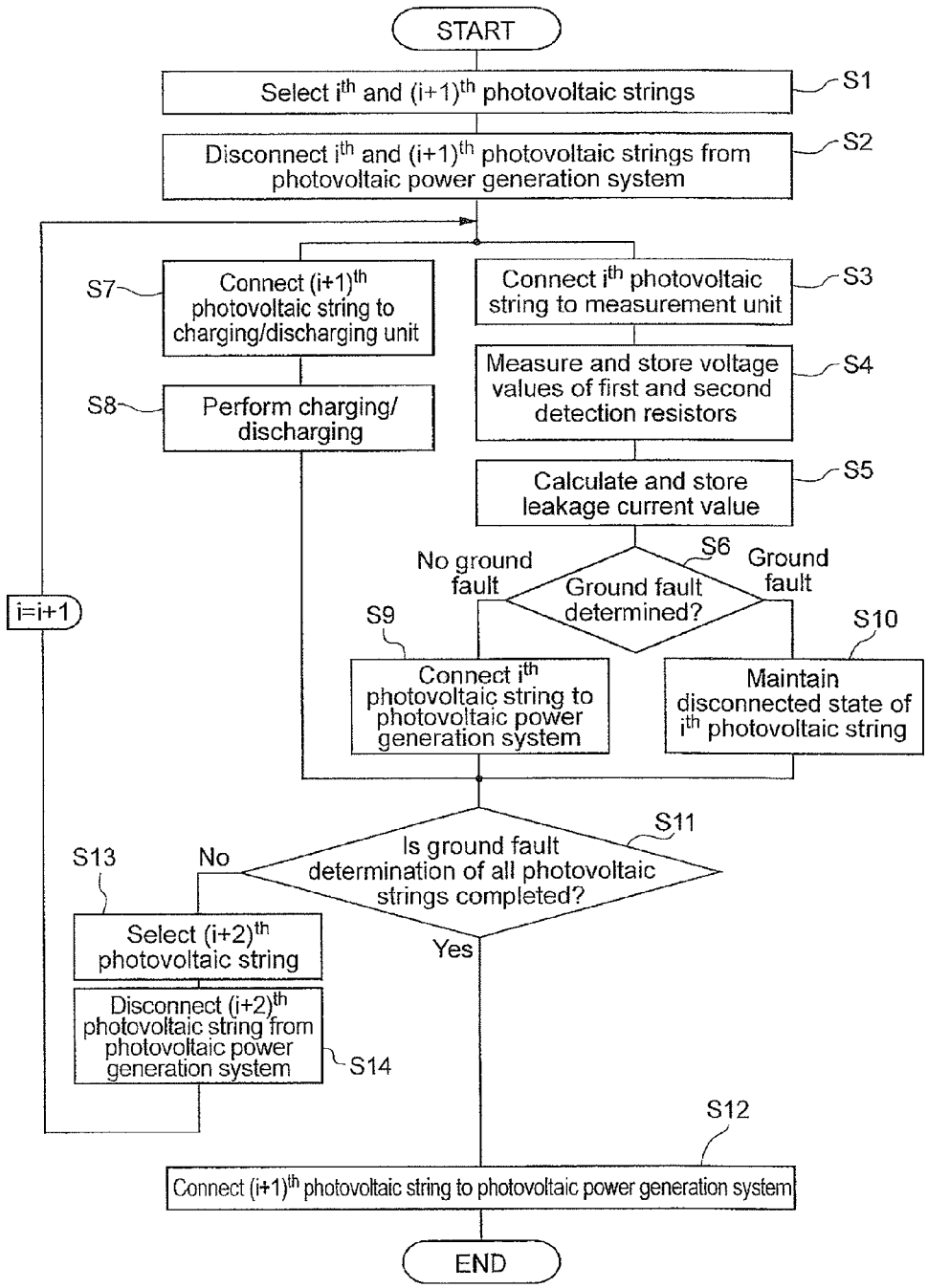
FIG. 4 is a flowchart illustrating operation of the ground fault detection device of FIG. 1.

Next, an example of the ground fault detection method (operation of the ground fault detection program) performed by the ground fault detection device 1 will be illustrated and described with reference to a flowchart illustrated in FIG. 4.

When a ground fault within the photovoltaic array 101 is detected in the ground fault detection device 1 described above, two photovoltaic strings 103 among the plurality of photovoltaic strings 103 are sequentially disconnected from the photovoltaic power generation system 100, for example, as illustrated in an operation scheme of FIG. 5 (a bold frame in FIG. 5). In this case, a predetermined measurement is performed on one photovoltaic string 103 in a disconnected state as a measurement target string 103, and in parallel therewith, the other photovoltaic string 103 which is in the disconnected state and has not yet been subjected to the predetermined measurement is charged/discharged as a charging/discharging target string 103.

Further, the photovoltaic array 101 including eight photovoltaic strings 103 is illustrated in FIG. 5. Further, states of the ground fault detection device 1 illustrated in FIGS. 1 and 2 correspond to states when TIME=1 and 2 in FIG. 5, respectively.

Specifically, various functions of the calculation control unit 5 are executed to perform the following process. In other words, when i is an integer equal to or more than 1, i=i−n when i>n, and an initial value of i is n, the $i^{th}$ and $(i+1)^{th}$ photovoltaic strings $103_n$ and $103_1$ to be disconnected from the photovoltaic power generation system 100 are first selected from among the plurality of photovoltaic strings 103, as illustrated in the flowchart of FIG. 4 (S1).

Then, the disconnection switch elements 7a corresponding to the $i^{th}$ and $(i+1)^{th}$ selected photovoltaic strings $103_n$ and $103_1$ are turned off. Accordingly, the $i^{th}$ and $(i+1)^{th}$ photovoltaic strings $103_n$ and $103_1$ are electrically separated from the photovoltaic power generation system 100 and enter a disconnected state (S2: see FIG. 1).

Subsequently, one $i^{th}$ photovoltaic string $103_n$ of the $i^{th}$ and $(i+1)^{th}$ photovoltaic strings $103_n$ and $103_1$ in the disconnected state is set to a measurement target string and the corresponding measurement switch element 8a is turned on to connect the $i^{th}$ photovoltaic string $103_n$ to the measuring instrument 3 (S3). In this state, voltage values V11 and V12 of the first and second detection resistors 11 and 12 are measured by the voltmeters 13 and 14, and a result of the measurement is stored in the storage unit 6 (S4).

Subsequently, a leakage current value $I_{leak}$ is calculated using Equation (1) below from the stored voltage values V11 and V12 and stored in the storage unit 6 (S5). Subsequently, the stored leakage current value $I_{leak}$ and a reference current value stored in the storage unit 6 in advance are compared to perform a ground fault determination of the $i^{th}$ photovoltaic string $103_n$ (S6). Specifically, when the leakage current value $I_{leak}$ exceeds the reference current value, "ground fault" is determined, and when the leakage current value $I_{leak}$ is equal to or less than the reference current value, "no ground fault" is determined. Incidentally, the leakage current value $I_{leak}$ is a current value of a leakage current (i.e., a leak current or a zero-phase current) flowing between the first and second detection resistors 11 and 12 and the ground potential G.

$$I_{leak} = |V11/R11| - |V12/R12| \qquad (1)$$

Here, R11: Resistance value of the first detection resistor 11
R12: Resistance value of the second detection resistor 12

Further, in parallel with the process of S3 to S6 described above, the other $(i+1)^{th}$ photovoltaic string $103_1$ among the $i^{th}$ and $(i+1)^{th}$ photovoltaic strings $103_n$ and $103_1$ in the disconnected state is set to a charging/discharging target string, and the corresponding charging/discharging switch element $9a$ is turned on to connect the other $(i+1)^{th}$ photovoltaic string to the charging/discharging unit 4 (S7). Also, in this state, the $(i+1)^{th}$ photovoltaic string $103_1$ is charged/discharged by the charging/discharging unit 4 until an amount of charges stored in a capacitance relative to a ground of the $(i+1)^{th}$ photovoltaic string $103_1$ is the same as an amount of charges stored in a capacitance relative to a ground when the $(i+1)^{th}$ photovoltaic string $103_1$ is connected to the measuring instrument 3 (S8).

In other words, in this embodiment, charging/discharging of the $(i+1)^{th}$ photovoltaic string $103_1$ is preprocessed in a background simultaneously and in parallel with (at the same timing as) the measurement of the $i^{th}$ photovoltaic string $103n$ so that the measurement of the $(i+1)^{th}$ photovoltaic string $103_1$ can be performed immediately after the photovoltaic string is connected to the measuring instrument 3 when the measurement is performed in a subsequent step.

Subsequently, if a ground fault determination result in S6 described above is "no ground fault," the disconnection switch elements $7a$ and $7a$ are turned on for the $i^{th}$ photovoltaic string $103n$ in the disconnected state to connect the $i^{th}$ photovoltaic string $103n$ to the photovoltaic power generation system 100, and the measurement switch elements $8a$ and $8a$ are turned off to separate the $i^{th}$ photovoltaic string $103n$ from the measuring instrument 3 (S9). Further, if the ground fault determination result is "ground fault," the disconnection switch elements $7a$ and $7a$ remain off to be kept in the disconnected state (maintain the disconnected state) for the $i^{th}$ photovoltaic string $103_n$ in the disconnected state, and the measurement switch elements $8a$ and $8a$ are turned off to separate the $i^{th}$ photovoltaic string $103_n$ from the measuring instrument 3 (S10).

Subsequently, when the ground fault detection of all the photovoltaic strings 103 (S3 to S6 described above) is completed, the disconnection switch elements $7a$ and $7a$ are turned on for the $(i+1)^{th}$ photovoltaic string 103 as the charging/discharging target string to connect the $(i+1)^{th}$ photovoltaic string 103 to the photovoltaic power generation system 100, the charging/discharging switch elements $9a$ and $9a$ are turned off to separate the $(i+1)^{th}$ photovoltaic string 103 from the charging/discharging unit 4, and the ground fault detection ends (S11 and S12).

On the other hand, when the ground fault detection is not completed, another $(i+2)^{th}$ photovoltaic string $103_2$ is further selected from among the plurality of photovoltaic strings 103 connected to the photovoltaic power generation system 100 (S13). The disconnection switch element $7a$ corresponding to the selected $(i+2)^{th}$ photovoltaic string $103_2$ is turned off to thereby electrically separate and disconnect the $(i+2)^{th}$ photovoltaic string $103_2$ from the photovoltaic power generation system 100 to enter the disconnected state (S14: see FIG. 2).

Also, S3 to S14 described above are repeated with i=i+1 until the ground fault determination is completed for all the photovoltaic strings 103, and then the process ends.

Incidentally, in the above description, the charging/discharging unit 4 may be connected to the photovoltaic string $103_n$ which is the measurement target in advance and charge/discharge the photovoltaic string $103_n$, prior to S3 described above (i.e., before the photovoltaic string 103 is first connected to the measuring instrument 3 at the time of ground fault detection). Or, a standby time may be provided only immediately after the photovoltaic string $103_n$ is connected to the measuring instrument 3 (i.e., immediately after the photovoltaic string 103 is first connected to the measuring instrument 3 at the time of ground fault detection). Further, in the above description, when a predetermined measurement is performed on the last photovoltaic string 103 among the plurality of photovoltaic strings 103, charging/discharging of the photovoltaic string 103 to be performed in parallel with the measurement may be omitted. For this, the same applies to the following embodiments.

Further, in this embodiment, while the configuration in which the voltage value V11 of the first detection resistor 11 is measured by the first voltmeter 13 and the voltage value V12 of the second detection resistor 12 is measured by the second voltmeter 14 is adopted, a configuration in which current values I11 and I12 flowing through the first and second detection resistors 11 and 12 are measured may be adopted. In this case, the calculation control unit 5 can calculate a leakage current value $I_{leak}$ using $I_{leak}=|I11|-|I12|$.

As described above, in this embodiment, the photovoltaic string 103, which is the measurement target string on which the predetermined measurement necessary for ground fault detection is to be performed, is electrically separated and disconnected from the photovoltaic power generation system 100. Thus, since the measurement is performed with the measurement target in small units, the capacitance relative to the ground of the measurement target can be reduced (i.e., an electrical path of the measurement target can be shortened and a total area can be reduced), and adverse effects of a current flowing due to the capacitance relative to a ground on the ground fault detection can be suppressed.

Herewith, the photovoltaic string 103 is electrically separated from the power conditioner 102 at the time of ground fault detection, thereby suppressing adverse effects of a noise generated due to the power conditioner 102 on the ground fault detection. Therefore, it is possible to reliably detect the ground fault.

Here, generally, the measured voltage values V11 and V12 (measurement values) may vary due to the capacitance relative to the ground of the photovoltaic string 103 immediately after the photovoltaic string 103 is connected to the measuring instrument 3 by turning on the measurement switch elements $8a$ and $8a$ in the photovoltaic string 103, and therefore, it is usually necessary to wait until such a variation settles before performing the measurement.

In this regard, in this embodiment, the predetermined measurement (measurement of the voltage values V11 and V12) is performed on one measurement target string 103 of two or more disconnected photovoltaic strings 103, and in parallel therewith, the one charging/discharging target string 103 before the predetermined measurement is performed is charged/discharged in advance, as described above. Thus, it is possible to suppress a variation of the voltage values V11 and V12 to be measured, and to directly perform the measurement without waiting immediately after the measuring instrument 3 is connected to the photovoltaic string 103. Therefore, it is possible to shorten a time required for detection of the ground fault within the photovoltaic array 101 (a total time taken for ground fault detection of the photovoltaic array 101).

Further, as described above, the number of measurement target strings 103 to be subjected to the predetermined measurement and the number of charging/discharging target strings 103 to be charged/discharged, which are necessary for ground fault detection, are equal to each other and are m (here, 1), and therefore all (m) charged/discharged photovoltaic strings 103 can be measured at a next timing, and no unnecessarily disconnected photovoltaic string 103 is generated. Therefore, it is possible to reduce unnecessary degradation of a power generation amount during the ground fault detection.

Particularly, in this embodiment, the ground fault of the measurement target string 103 can be detected by monitoring the voltage values V11 and V12 in the first and second detection resistors 11 and 12 connected to the measurement target string 103 in the disconnected state, as described above. Also, in parallel therewith, the charging/discharging target string 103 in the disconnected state can be grounded and charged/discharged.

Further, in this embodiment, when the ground fault is not detected for the photovoltaic string 103 in the disconnected state, the photovoltaic string 103 can be electrically connected to the photovoltaic power generation system 100, as described above. In other words, the photovoltaic string 103 in which the ground fault is not detected can be automatically connected to the photovoltaic power generation system 100. Further, when the ground fault is detected, the photovoltaic string 103 can remain in the disconnected state, as described above. In other words, in the photovoltaic power generation system 100, an insulation failure point can be electrically separated to increase safety.

Further, in this embodiment, since the photovoltaic strings 103 other than the measurement target and the charging/discharging target are still connected to the power conditioner 102 at the time of ground fault detection, power generation can be effectively performed even at the time of ground fault detection.

Further, in this embodiment, voltage application is unnecessary and safety can be secured at the time of ground fault detection. Further, since measurement accuracy of the voltmeters 13 and 14 is generally higher than that of ammeters, the current value $I_{leak}$ can be recognized with high precision when the voltage values V11 and V12 are measured to obtain the current value $I_{leak}$ and, thus the ground fault can be detected with high precision, as in this embodiment.

Further, even when the power conditioner 102 is a transformerless type and the photovoltaic array 101 is connected to a grounded power system, the ground fault of the photovoltaic string 103 in the disconnected state can be detected in this embodiment, and therefore (1) described above can be established and the ground fault can be reliably detected. As a result, it is possible to reliably detect the ground fault regardless of an insulation type/non-insulation type of power conditioner 102 to be connected to the photovoltaic array 101, and to meet various needs of users.

Further, in this embodiment, the measurement is performed by the measuring instrument 3 without electrically connecting the photovoltaic string 103 to the photovoltaic power generation system 100 after charging/discharging of the charging/discharging unit 4, as described above. In other words, the charging/discharging and the measurement are continuously performed on the photovoltaic string 103 between the disconnection of the photovoltaic string 103 and the subsequent re-connection of the photovoltaic string 103. Thus, it is possible to perform the measurement without losing effects of the charging/discharging of the photovoltaic string 103.

The string selection function and the disconnection control function from above constitute a disconnection function in the claims, and the measurement instructing function constitutes a measurement function in the claims. The storage function, the calculation function and the ground fault determination function constitute a ground fault detection function in the claims. Further, the charging/discharging instructing function constitutes a charging/discharging function in the claims. Further, the measuring instrument 3 and the measurement switch 8 constitute a measurement unit in the claims, and the charging/discharging unit 4 and charging/discharging switch 9 constitute a charging/discharging unit in the claims.

Second Embodiment

Next, a second embodiment of the present invention will be described. Further, differences between the second embodiment and the first embodiment will be mainly described in the description of the second embodiment.

Figure 6:
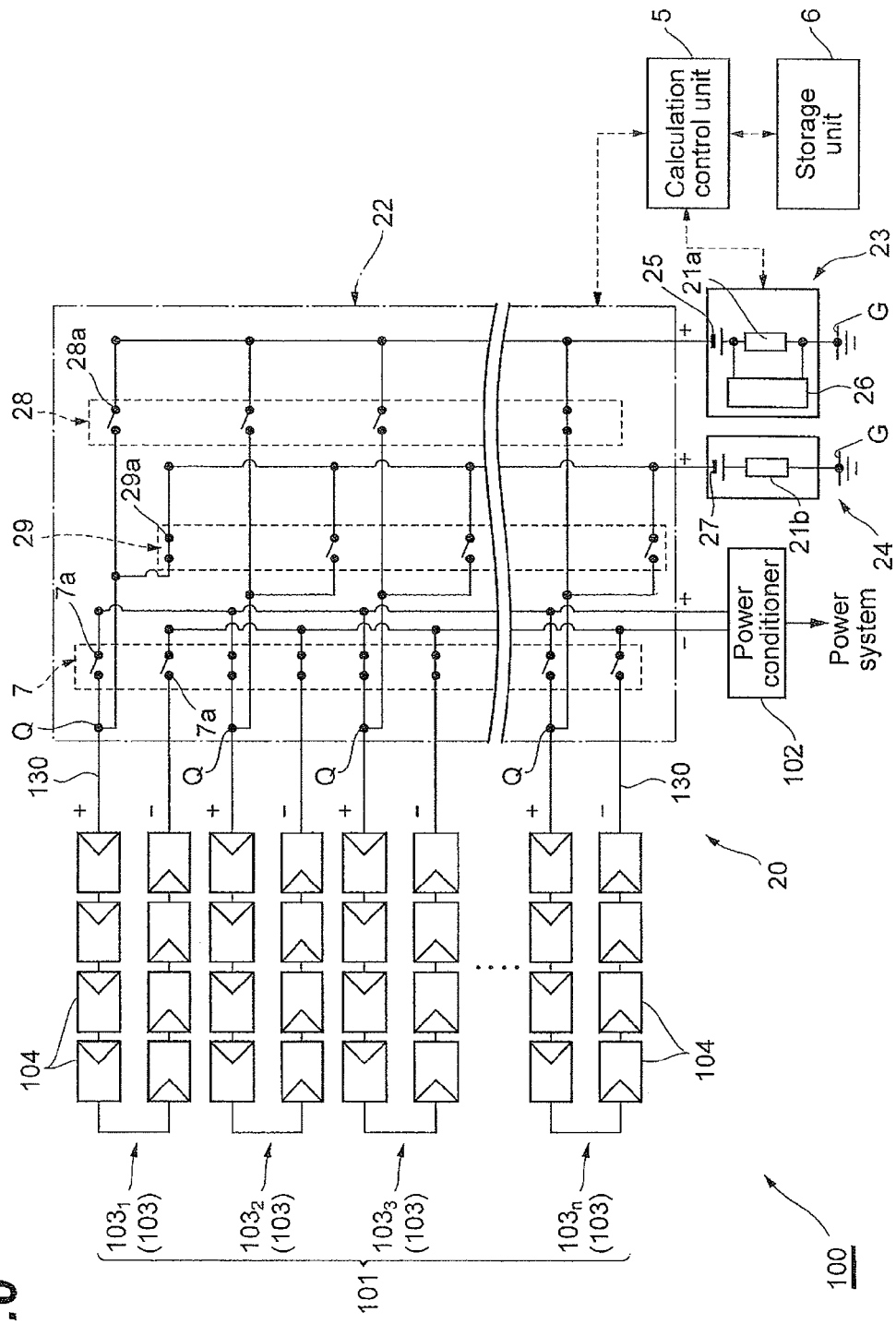
FIG. 6 is a schematic configuration diagram illustrating a state of a photovoltaic power generation system including a ground fault detection device according to a second embodiment.
Figure 7:
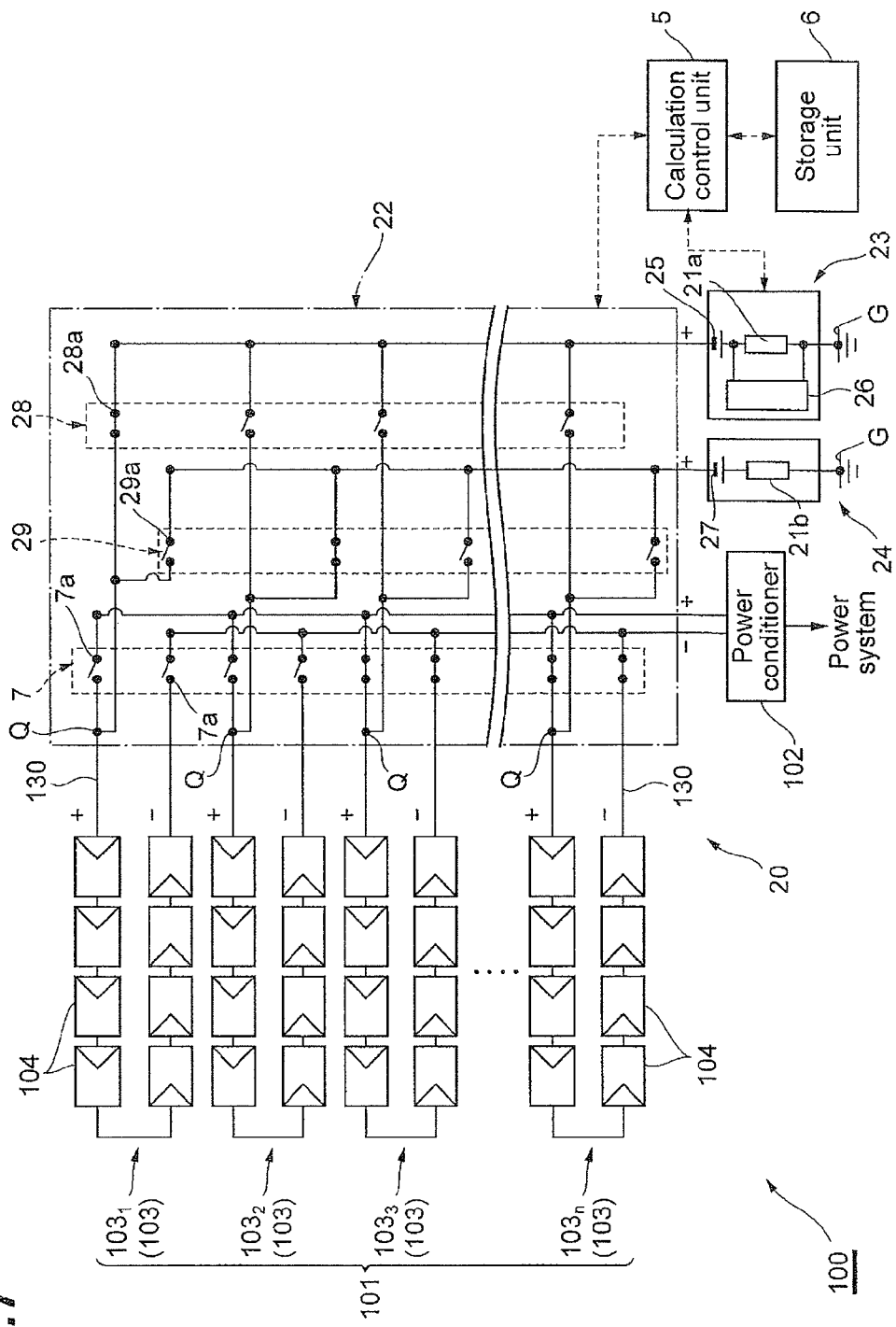
FIG. 7 is a schematic configuration diagram illustrating another state in the photovoltaic power generation system of FIG. 6.

FIGS. 6 and 7 are schematic configurations illustrating a photovoltaic power generation system including a ground fault detection device according to the second embodiment. The ground fault detection device 20 of this embodiment is different from the ground fault detection device 1 described above in that a switching unit 22 is included in place of the switching unit 2 (see FIG. 1), a measuring instrument 23 is included in place of the measuring instrument 3 (see FIG. 1), and a charging/discharging unit 24 is included in place of the charging/discharging unit 4 (see FIG. 1), as illustrated in FIGS. 6 and 7. Further, states of the ground fault detection device 20 illustrated in FIGS. 6 and 7 correspond to states when TIME=1 and 2 in FIG. 5, respectively.

The switching unit 22 includes the disconnection switch 7, a measurement switch 28 similar to the measurement switch 8, and a charging/discharging switch 29 similar to the charging/discharging switch 9. The measurement switch 28 includes a plurality of measurement switch elements 28a connected in series with positive electrodes of the respective photovoltaic strings 103. The charging/discharging switch 29 includes a plurality of charging/discharging switch elements 29a connected in series with the positive electrodes of the respective photovoltaic strings 103.

The measuring instrument 23 includes a measurement direct current power supply 25 which applies a voltage (DC bias) having a direct current voltage value $V_{Dsource}$ to the photovoltaic string 103. One side of the measurement direct current power supply 25 is a positive electrode side and is connected to the ground potential G through a detection resistor 21a. On the other hand, the other side of the measurement direct current power supply 25 is a negative electrode side, and is electrically connectable to a positive electrode bus of the photovoltaic string 103 through the measurement switch 28. Here, the other side of the measurement direct current power supply 25 is connectable to a predetermined point Q in an electrical path 130 between the photovoltaic string 103 and the power conditioner 102.

Further, the direct current voltage value $V_{Dsource}$ is equal to or more than a predetermined lower limit value from the viewpoint of sensitivity improvement of the ground fault detection, and is equal to or less than a predetermined upper limit value from the viewpoint of prevention of damage of a photovoltaic circuit which is a measurement target. Further, the direct current voltage value $V_{Dsource}$ herein is the same voltage value as a voltage value of one photovoltaic string 103 as a preferred value. This measurement direct current power supply 25 is connected to a calculation control unit 5, and applies a direct current voltage value $V_{Dsource}$ according to an instruction signal from the calculation control unit 5. The calculation control unit 5 stores the direct current voltage value $V_{Dsource}$ in a storage unit 6.

Further, the measuring instrument 23 includes a voltmeter 26 which detects a voltage value V21 generated in the detection resistor 21a. The voltmeter 26 is electrically connected between the measurement direct current power supply 25 and the detection resistor 21a and between the detection resistor 21a and the ground potential G. The voltmeter 26 is connected to the calculation control unit 5 and performs measurement of the voltage value V21 according to an instruction signal from the calculation control unit 5. The calculation control unit 5 stores a result of the measurement in the storage unit 6.

The charging/discharging unit 24 includes a charging/discharging direct current power supply 27 which is similar to the measurement direct current power supply 25. One side of this charging/discharging direct current power supply 27 is a positive electrode side and is connected to the ground potential G through a charging/discharging resistor 21b. On the other hand, the other side of the charging/discharging direct current power supply 27 is a negative electrode side, and is electrically connectable to a positive electrode bus of the photovoltaic string 103 through the charging/discharging switch 29. Here, the other side of the charging/discharging direct current power supply 27 is connectable to a predetermined point Q in an electrical path 130 between the photovoltaic string 103 and the power conditioner 102. The charging/discharging resistor 21b is set so that its resistance value is the same as a resistance value of the detection resistor 21a in the measuring instrument 23.

When a ground fault within the photovoltaic array 101 is detected in this embodiment configured in this way, two photovoltaic strings 103 among the plurality of photovoltaic strings 103 are sequentially disconnected from the photovoltaic power generation system 100. Measurement is performed on m (here, 1) photovoltaic strings 103 in the disconnected state, which are measurement target strings, and in parallel therewith, the m photovoltaic strings 103 which are in the disconnected state, separate from the measurement target strings, and have not yet been measured are charged/discharged as charging/discharging target strings.

Figure 8:
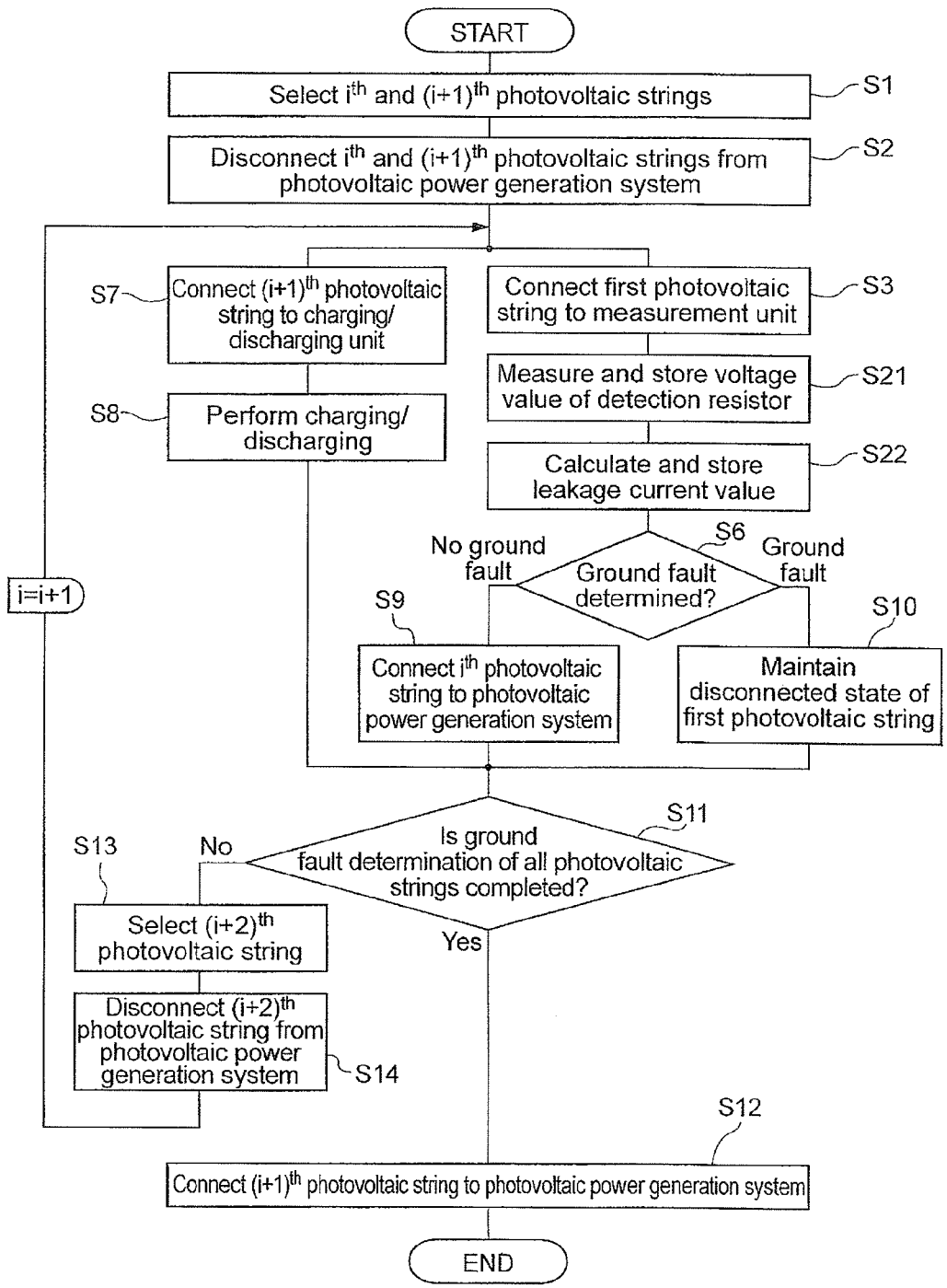
FIG. 8 is a flowchart illustrating operation of the ground fault detection device of FIG. 6.

Next, an example of a ground fault detection method (operation of the ground fault detection program) performed by the ground fault detection device 20 is illustrated and described with reference to a flowchart illustrated in FIG. 8. In other words, when i is an integer equal to or more than 1, i=i−n when i>n, and an initial value of i is n, $i^{th}$ one photovoltaic string 103n in the disconnected state is connected to the measuring instrument 23 (S3 described above), and then a voltage value V21 of the detection resistor 21a is measured and stored in the storage unit 6 (S21). Subsequently, a leakage current value $I_{leak}$ is calculated using Equation (2) below based on the stored voltage value V21 (S22). Also, the process proceeds to S6 described above to compare the calculated leakage current value $I_{leak}$ with a reference current value stored in the storage unit 6 in advance to determine a ground fault.

$$I_{leak2} = V21/R_{21} \quad (2)$$

Here, $R_{21}$: Resistance value of the detection resistor 21a

As described above, a predetermined measurement can be performed on the measurement target string 103 in the disconnected state, and in parallel therewith, the charging/discharging target string 103 which is in a disconnected state and has not yet been subjected to the predetermined measurement can be charged/discharged in advance in this embodiment as well. Thus, the above action effects, i.e., action effects of reliably detecting the ground fault and shortening a time required for detection of the ground fault, are achieved.

Particularly, in this embodiment, as described above, the measurement direct current power supply 25 and the detection resistor 21a are connected to the measurement target string 103 in the disconnected state, and the voltage value V21 generated in the detection resistor 21a and further the leakage current value (ground fault current) $I_{leak2}$ are monitored such that the ground fault of the measurement target string 103 can be detected. Also, in parallel therewith, the charging/discharging target string 103 in the disconnected state can be grounded and charged/discharged.

Further, in this embodiment, in the ground fault detection, the voltage can be applied to the disconnected photovoltaic string 103 by the direct current power supply 25 having one side connected to the ground potential G, and the potential relative to the ground of the photovoltaic string 103 can be intentionally changed to measure the ground fault current.

Further, in this embodiment, as described above, the other side of the measurement direct current power supply 25 and the other side of the charging/discharging direct current power supply 27 are connected to the predetermined point Q at one point in the electrical path 130 between the individual disconnected photovoltaic string 103 and the power conditioner 102 together. Therefore, the number of wirings, switches and the like for the measuring instrument 23 and the charging/discharging unit 24, on the electrical path 130 can be reduced, thus simplifying the configuration.

Further, in this embodiment, as described above, the negative electrode side in the measurement direct current power supply 25 is connected to the positive electrode side of the measurement target string 103, and the negative electrode side in the charging/discharging direct current power supply 27 is connected to the positive electrode side of the charging/discharging target string 103. Therefore, when measurement is performed by the measurement unit 23, an absolute value of the potential relative to the ground of the measurement target string 103 can be increased or decreased, and as a result, a potential difference between any point of the photovoltaic string 103 and the ground potential G is easily generated at the point of the photovoltaic string 103, sensitivity of the ground fault detection can be increased, and the ground fault detection can be reliably performed irrespective of the ground fault point.

Further, as described above, since the photovoltaic string 103 is disconnected to perform the ground fault detection, a direct current voltage from the measurement direct current power supply 25 can be prevented from being applied to the power conditioner 102, a burden on parts such as a surge absorber or a capacitor relative to a ground within the power conditioner 102 and degradation of lifespan can be suppressed, and damage of the device can be prevented.

Further, while the other sides of the direct current power supplies 25 and 27 are electrically connected to the positive electrode bus of the photovoltaic string 103 in this embodiment, the other sides of the direct current power supplies 25 and 27 may be electrically connected to the negative electrode bus of the photovoltaic string 103. In this case, one sides of the direct current power supplies 25 and 27 are the negative electrode sides and are connected to the ground potential G through the resistors 21a and 21b, whereas the other sides of the direct current power supplies 25 and 27 are the positive electrode sides and are electrically connected to the negative electrode bus of the photovoltaic string 103.

Further, while the configuration in which the voltage value of the detection resistor 21a is measured by the voltmeter 26 is adopted in this embodiment, a configuration in which a current flowing through the detection resistor 21a is measured by an ammeter may be adopted. In this case, a value of the measured current becomes a leakage current value.

Third Embodiment

Next, a third embodiment of the present invention will be described. Further, differences between this embodiment and the first embodiment will be mainly described in the description of the third embodiment.

FIGS. 9 to 12 are schematic configurations illustrating a photovoltaic power generation system including a ground fault detection device according to the third embodiment. The ground fault detection device 30 of this embodiment is different from the ground fault detection device 1 in that a measuring instrument 33 is included in place of the measuring instrument 3 (see FIG. 1), and a charging/discharging unit 34 is included in place of the charging/discharging unit 4 (see FIG. 1), as illustrated in FIGS. 9 to 12.

The measuring instrument 33 includes, on an electrical measurement path Ds, a detection resistor 31 having one side connected to the ground potential G, and a voltmeter 32 which measures a voltage value V31 generated in the detection resistor 31. The other side of the detection resistor 31 is electrically connectable to either a positive electrode bus or a negative electrode bus of the photovoltaic string 103 through the measurement switch 8. In other words, one side of the electrical measurement path Ds is connected to the ground potential G, and the other side thereof is connectable to the positive electrode side and the negative electrode side of the plurality of photovoltaic strings 103.

The voltmeter 32 is electrically connected between the switching unit 2 and the detection resistor 31 and between the detection resistor 31 and the ground potential G, and measures a voltage drop value and its sign of the detection resistor 31. Here, when the detection resistor 31 is connected to the positive electrode side of the photovoltaic string 103 by the measurement switch 8, the voltmeter 32 measures a voltage drop value as a positive electrode-side voltage drop value (a first voltage drop value) V1, and when the detection resistor 31 is connected to the negative electrode side of the photovoltaic string 103 by the measurement switch 8, the voltmeter 32 measures a voltage drop value as a negative electrode-side voltage drop value (a second voltage drop value) V2. Further, the sign of the voltage drop value may be set, for example, in such a manner that a direction in which a current flows toward the ground potential G is positive, and a reverse direction is negative.

Further, the voltmeter 32 is also connected to the positive electrode bus and the negative electrode bus of each photovoltaic string 103 (not shown), and measures a potential difference between the positive electrode and the negative electrode of the disconnected photovoltaic string 103 (hereinafter referred to as "inter-electrode voltage value"), and its sign. The sign of the inter-electrode voltage value may be set, for example, by comparing a size of the positive electrode-side potential with a size of a negative electrode-side potential. Further, the voltmeter 32 is connected to the calculation control unit 5 and performs various measurements according to an instruction signal from the calculation control unit 5. The calculation control unit 5 stores a result of a measurement in the storage unit 6.

The charging/discharging unit 34 includes, on an electrical charging/discharging path Dj, a charging/discharging resistor 35 having one side connected to the ground potential G. The other side of the charging/discharging resistor 35 is electrically connectable to the positive electrode bus or the negative electrode bus of the photovoltaic string 103 through the charging/discharging switch 9. Further, the charging/discharging resistor 35 is set so that its resistance value is the same as a resistance value of the detection resistor 31 in the measuring instrument 33. In other words, one side of the electrical charging/discharging path Dj is connected to the ground potential and the other side thereof is connectable to the positive electrode side and the negative electrode side of the plurality of photovoltaic strings 103. This electrical charging/discharging path Dj has the same resistance value as the electrical measurement path Ds.

In such an embodiment, when a ground fault within the photovoltaic array 101 is detected, two photovoltaic strings 103 among the plurality of photovoltaic strings 103 are sequentially disconnected from the photovoltaic power generation system 100, for example, as illustrated in an operation scheme of FIG. 13 (a bold frame in FIG. 13). In this case, the measuring instrument 33 is connected to the positive electrode side or the negative electrode side in one photovoltaic string 103 in the disconnected state to measure a voltage drop value of the detection resistor 31, and in parallel therewith, the charging/discharging unit 34 is connected to the positive electrode side or the negative electrode side in the other photovoltaic string 103 which is in the disconnected state and has not yet been measured, to charge/discharge the photovoltaic string.

Further, a photovoltaic array 101 including eight photovoltaic strings 103 is illustrated in FIG. 13. Further, states of the ground fault detection device 30 illustrated in FIGS. 9 to 12 correspond to states when TIME=1 to 4 in FIG. 13, respectively.

Figure 14:
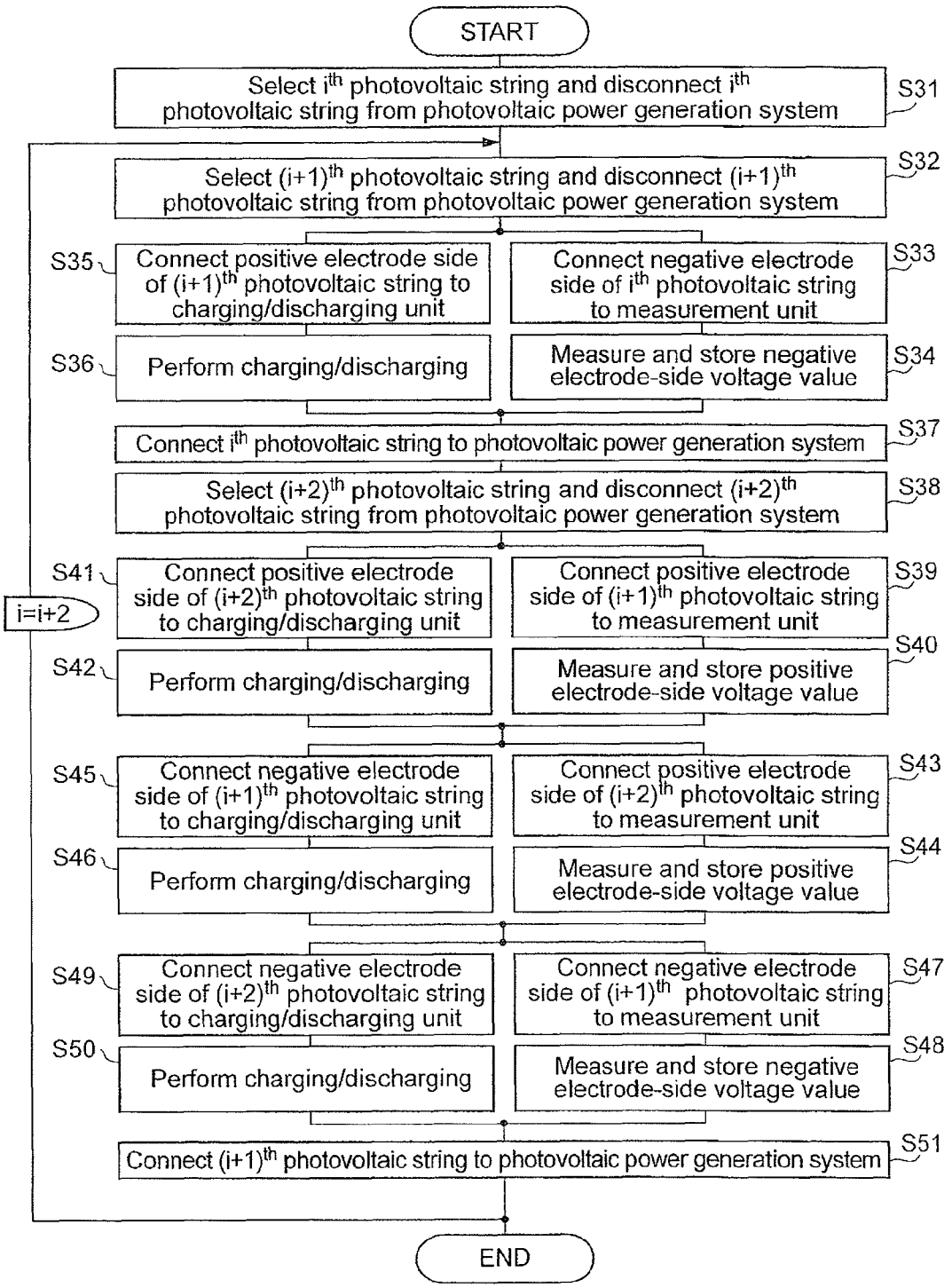
FIG. 14 is a flowchart illustrating operation of the ground fault detection device of FIG. 9.
Figure 15:
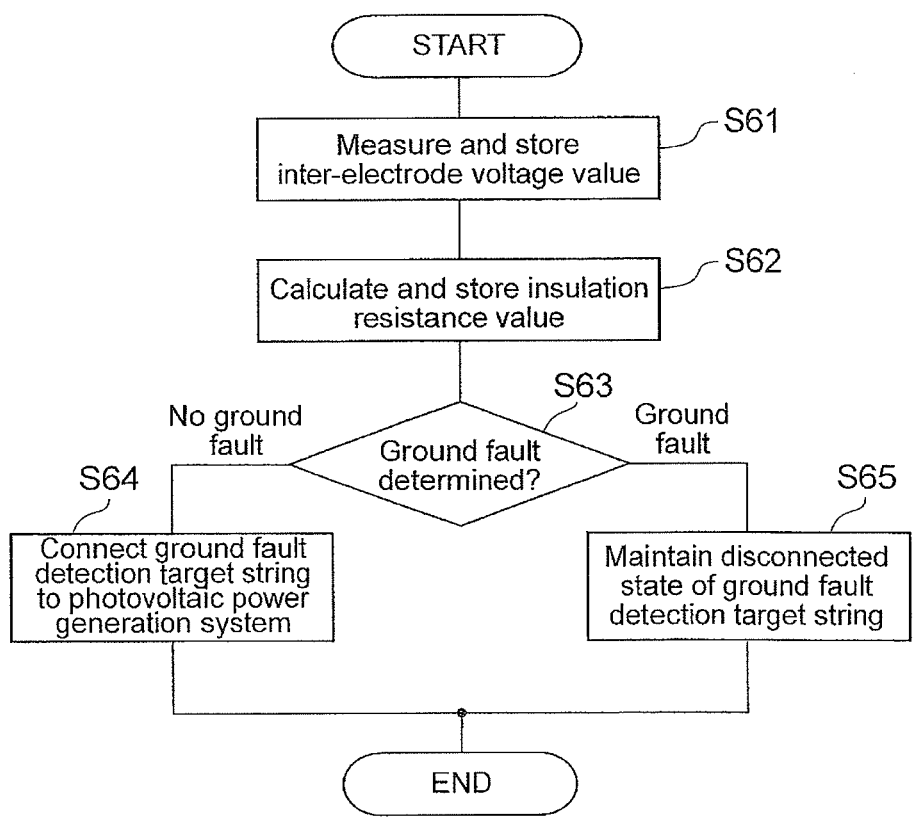
FIG. 15 is a flowchart illustrating another operation of the ground fault detection device of FIG. 9.
Figure 16:
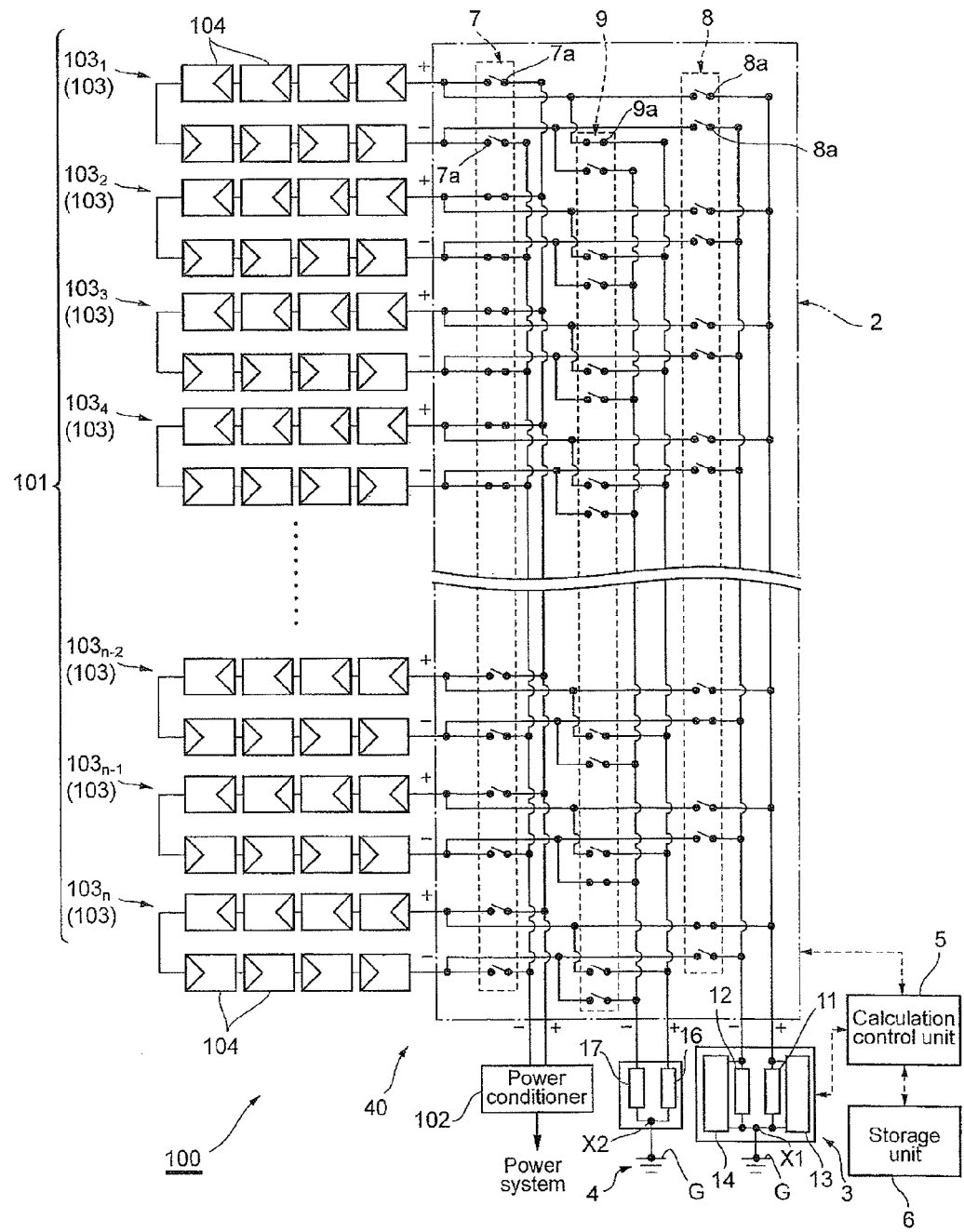
FIG. 16 is a schematic configuration diagram illustrating a state of a photovoltaic power generation system including a ground fault detection device according to a fourth embodiment.
Figure 17:
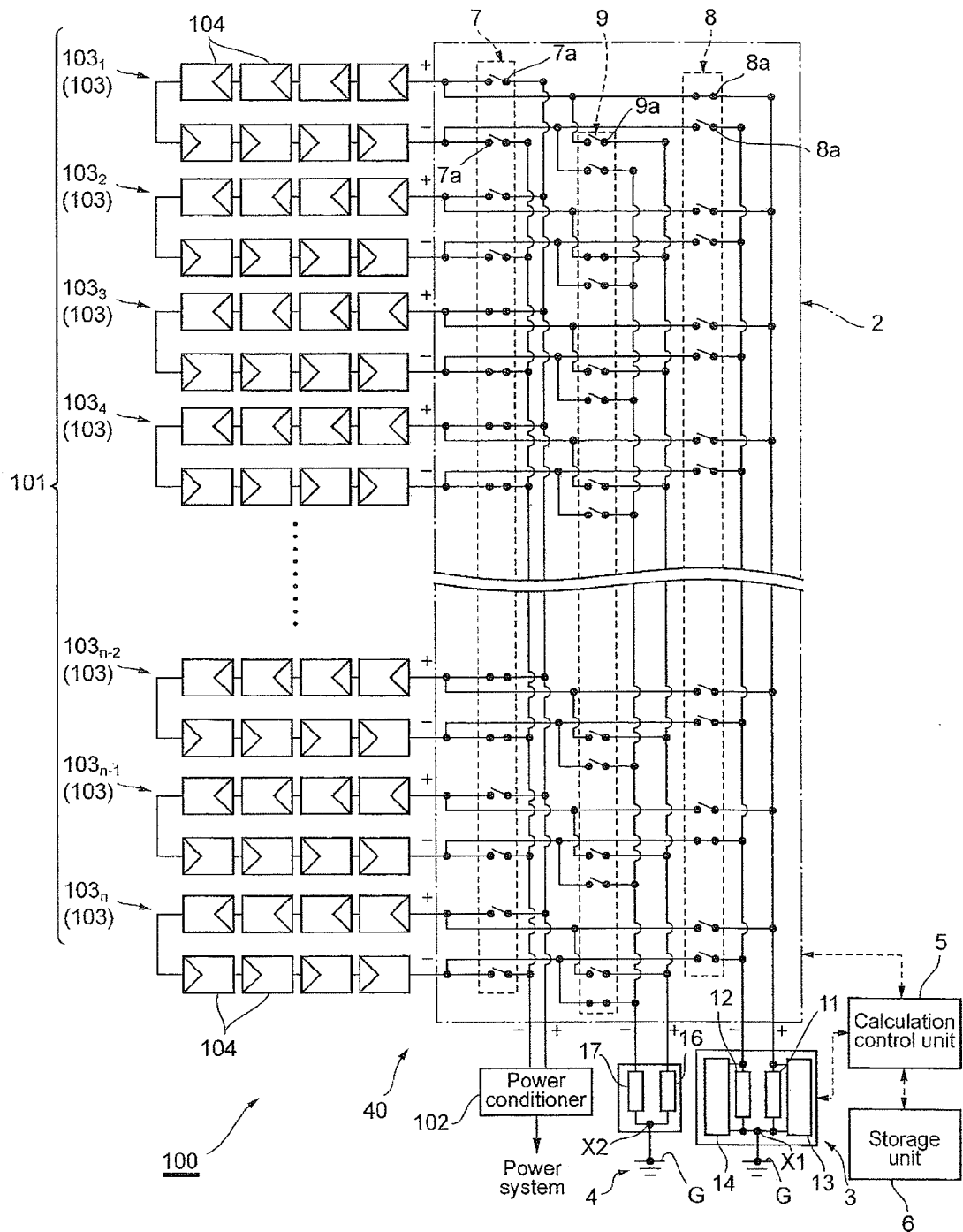
FIG. 17 is a schematic configuration diagram illustrating another state in the photovoltaic power generation system of FIG. 16.
Figure 18:
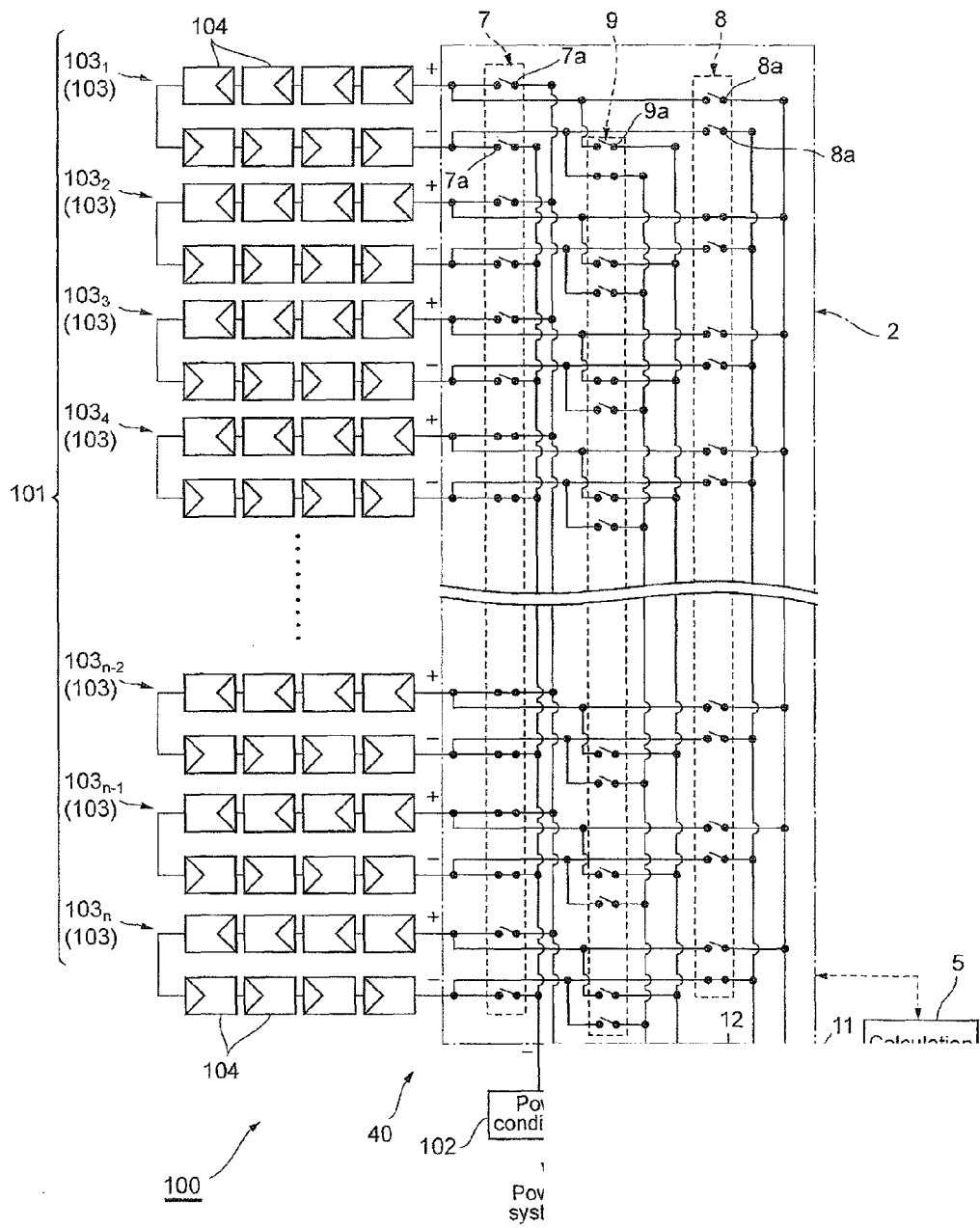
FIG. 18 is a schematic configuration diagram illustrating another separate state in the photovoltaic power generation system of FIG. 16.
Figure 19:
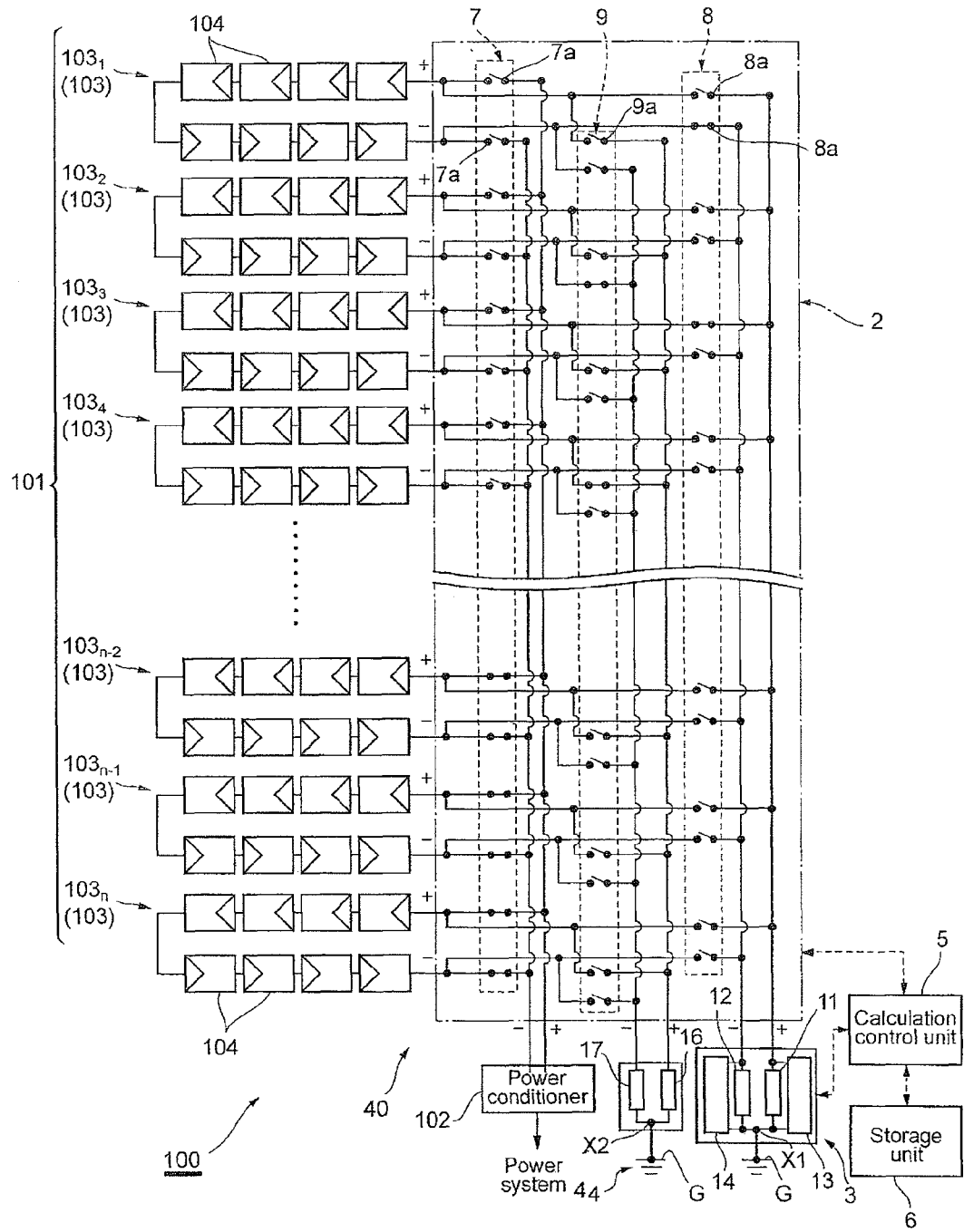
FIG. 19 is a schematic configuration diagram illustrating yet another separate state in the photovoltaic power generation system of FIG. 16.

Next, an example of a ground fault detection method (operation of the ground fault detection program) performed by the ground fault detection device 30 will be illustrated and described with reference to an operation scheme illustrated in FIG. 13 and a flowchart illustrated in FIGS. 14 and 15. In other words, when i is an integer equal to or more than 1, i=i−n when i>n, and an initial value of i is n, the $i^{th}$ photovoltaic string $103_n$ is first selected and disconnected from the photovoltaic power generation system 100, and the $(i+1)^{th}$ photovoltaic string $103_1$ is selected and disconnected from the photovoltaic power generation system 100, as illustrated in the flowchart of FIG. 14 (S31 and S32).

Figure 9:
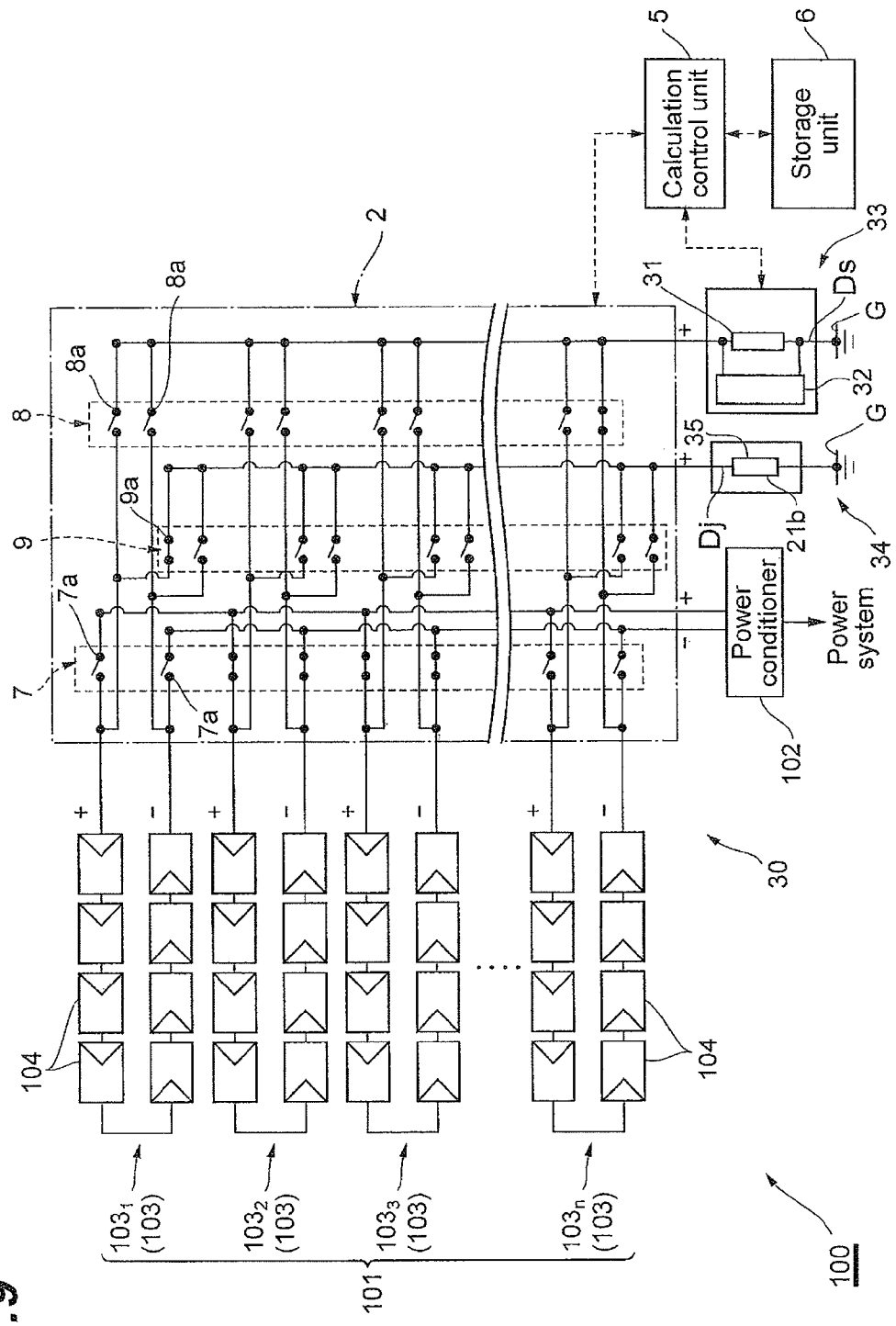
FIG. 9 is a schematic configuration diagram illustrating a state of a photovoltaic power generation system including a ground fault detection device according to a third embodiment.

Subsequently, as illustrated in FIG. 9, one $i^{th}$ photovoltaic string $103_n$ among the photovoltaic strings $103_n$ and $103_2$ in the disconnected state is set to the measurement target string, the measurement switch element 8a on the negative electrode side of the $i^{th}$ photovoltaic string $103_n$ is turned on to connect the $i^{th}$ photovoltaic string $103_n$ to the measuring instrument 33, and the measurement switch element 8a on the positive electrode side is turned off to disconnect the photovoltaic string (S33). In this state, a negative electrode-side voltage drop value V2 and its sign of the $i^{th}$ photovoltaic string 103, are measured by the voltmeter 32, and a result of the measurement is stored in the storage unit 6 (S34).

In parallel with the process of S33 and S34 described above, the other $(i+1)^{th}$ photovoltaic string $103_1$ in the disconnected state is set to the charging/discharging target string, and the charging/discharging switch element 9a on the positive electrode side of the $(i+1)^{th}$ photovoltaic string $103_1$ is turned on to connect the $(i+1)^{th}$ photovoltaic string $103_1$ to the charging/discharging unit 34 (S35). In this state, charging/discharging is performed by the charging/discharging unit 34 until an amount of charges stored in a capacitance relative to a ground of the $(i+1)^{th}$ photovoltaic string $103_1$ becomes the same as an amount of charges stored in a capacitance relative to the ground when the positive electrode side is connected to the measuring instrument 33 (S36).

Figure 10:
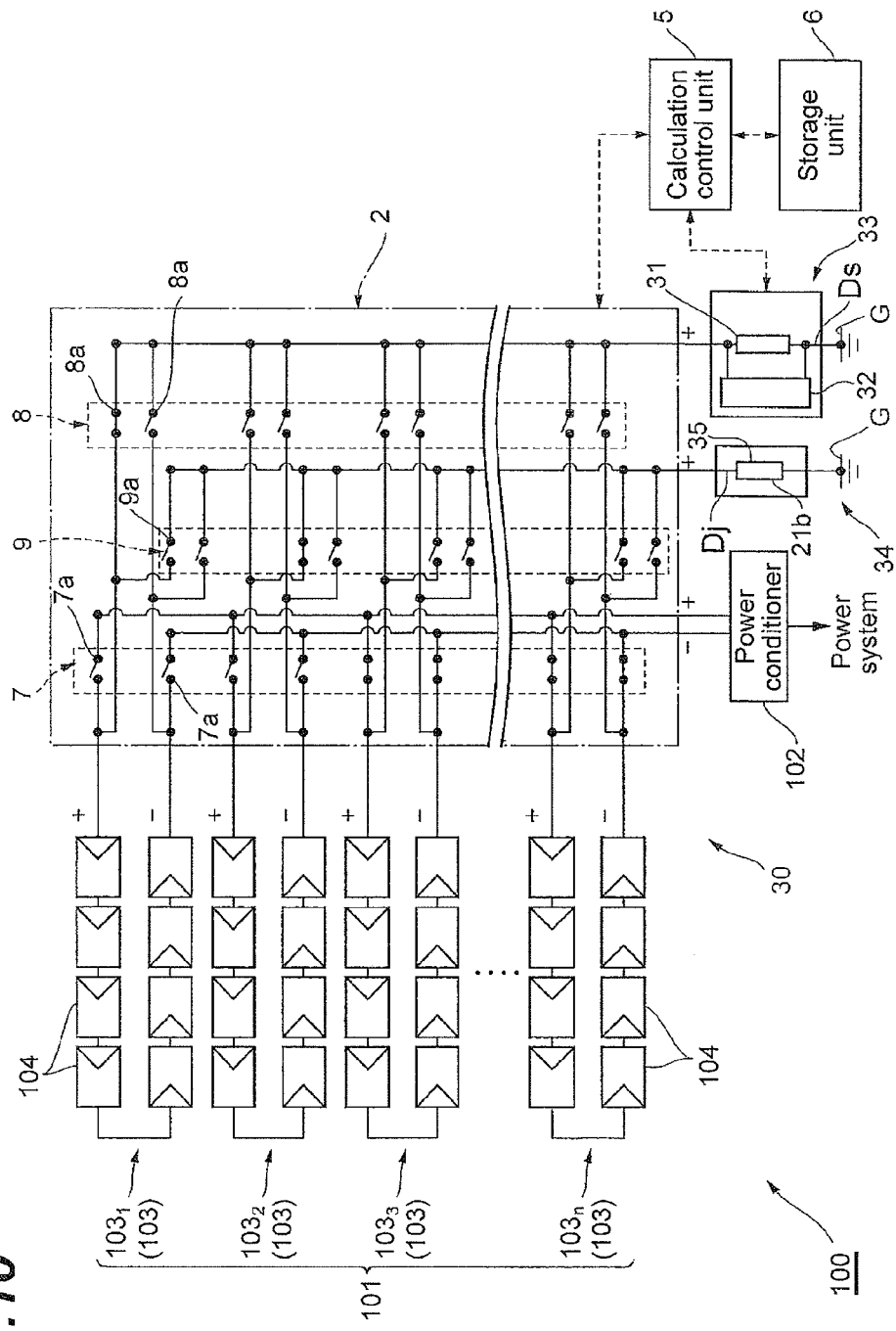
FIG. 10 is a schematic configuration diagram illustrating another state in the photovoltaic power generation system of FIG. 9.

Subsequently, the disconnection switch element 7a is turned on for the $i^{th}$ photovoltaic string $103_n$ in the disconnected state to connect the $i^{th}$ photovoltaic string 103n to the photovoltaic power generation system 100, as illustrated in FIG. 10 (S37). Also, another $(i+2)^{th}$ photovoltaic string 103, is further selected from among the plurality of photovoltaic strings 103 connected to the photovoltaic power generation system 100, and the corresponding disconnection switch element 7a is turned off to thereby electrically separate and disconnect the (i+2)$^{th}$ photovoltaic string 103$_2$ from the photovoltaic power generation system 100 to enter the disconnected state (S38).

Subsequently, after the measurement switch element 8a and the charging/discharging switch element 9a are turned off, the (i+1)$^{th}$ photovoltaic string 103$_1$ in the disconnected state is set to a measurement target string, the measurement switch element 8a on the positive electrode side of the (i+1)$^{th}$ photovoltaic string 103$_1$ is turned on to connect the photovoltaic string to the measuring instrument 33, and the measurement switch element 8a on the negative electrode side is turned off to disconnect the negative electrode side (S39). In this state, the positive electrode-side voltage drop value V1 and its sign of the (i+1)$^{th}$ photovoltaic string 103$_1$ are measured by the voltmeter 32 and a result of the measurement is stored in the storage unit 6 (S40).

In parallel with the process of S39 and S40 described above, the (i+2)$^{th}$ photovoltaic string 103$_2$ in the disconnected state is set to the charging/discharging target string, and the charging/discharging switch element 9a on the positive electrode side of the (i+2)$^{th}$ photovoltaic string 103$_2$ is turned on to connect the photovoltaic string to the charging/discharging unit 34 (S41). In this state, charging/discharging is performed by the charging/discharging unit 34 until an amount of charges stored in a capacitance relative to a ground of the (i+2)$^{th}$ photovoltaic string 103$_2$ is the same as an amount of charges stored in a capacitance relative to a ground when the positive electrode side is connected to the measuring instrument 33 (S42).

Figure 11:
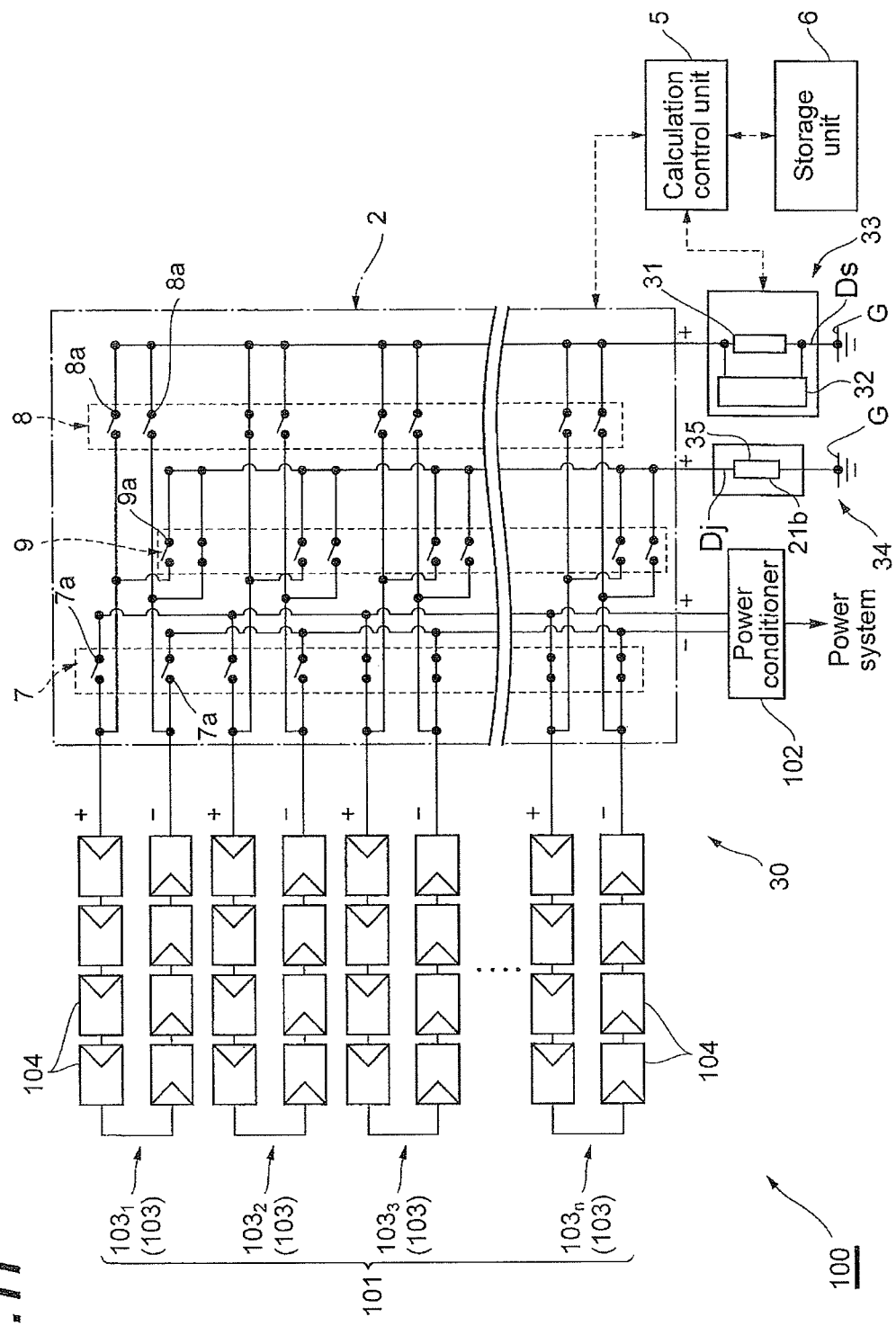
FIG. 11 is a schematic configuration diagram illustrating another separate state in the photovoltaic power generation system of FIG. 9.

Subsequently, after the measurement switch element 8a and the charging/discharging switch element 9a are turned off, the (i+2)$^{th}$ photovoltaic string 103$_2$ in the disconnected state is set to the measurement target string, and the measurement switch element 8a on the positive electrode side of the (i+2)$^{th}$ photovoltaic string 103$_2$ is turned on to connect the photovoltaic string to the measuring instrument 33, and the measurement switch element 8a on the negative electrode side is turned off to disconnect the photovoltaic string (S43), as illustrated in FIG. 11. In this state, the positive electrode-side voltage drop value V1 and its sign of the (i+2)$^{th}$ photovoltaic string 103$_2$ are measured by the voltmeter 32 and a result of the measurement is stored in the storage unit 6 (S44).

In parallel with the process of S43 and S44 described above, the (i+1)$^{th}$ photovoltaic string 103$_1$ in the disconnected state is set to the charging/discharging target string, and the charging/discharging switch element 9a on the negative electrode side of the (i+1)$^{th}$ photovoltaic string 103$_1$ is turned on to connect the photovoltaic string to the charging/discharging unit 34 (S45). In this state, charging/discharging is performed by the charging/discharging unit 34 until an amount of charges stored in a capacitance relative to a ground of the (i+1)$^{th}$ photovoltaic string 103$_1$ is the same as an amount of charges stored in a capacitance relative to a ground when the negative electrode side is connected to the measuring instrument 33 (S46).

Figure 12:
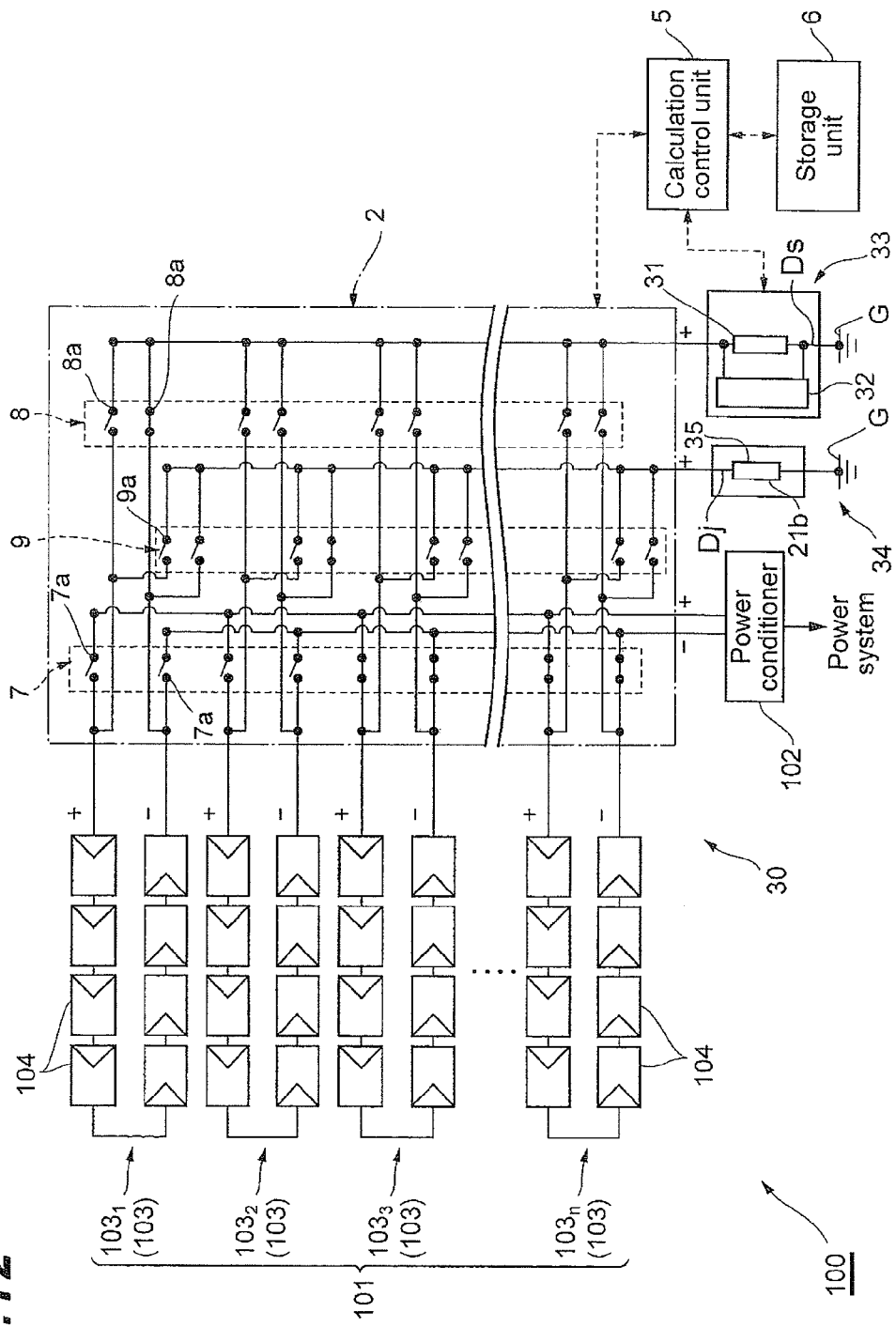
FIG. 12 is a schematic configuration diagram illustrating yet another separate state in the photovoltaic power generation system of FIG. 9.

Subsequently, after the measurement switch element 8a and the charging/discharging switch element 9a are turned off, the (i+1)$^{th}$ photovoltaic string 103$_1$ in the disconnected state is set to the measurement target string again, the measurement switch element 8a on the negative electrode side of the (i+1)$^{th}$ photovoltaic string 103$_1$ is turned on to connect the negative electrode side of the photovoltaic string to the measuring instrument 33, and the measurement switch element 8a on the positive electrode side is turned off to disconnect the photovoltaic string (S47), as illustrated in FIG. 12. In this state, the negative electrode-side voltage drop value V2 and its sign of the (i+1)$^{th}$ photovoltaic string 103$_1$ are measured by the voltmeter 32 and a result of the measurement is stored in the storage unit 6 (S48).

In parallel with the process of S47 and S48, the (i+2)$^{th}$ photovoltaic string 103$_2$ in the disconnected state is set to the charging/discharging target string again, and the charging/discharging switch element 9a on the negative electrode side of the (i+2)$^{th}$ photovoltaic string 103$_2$ is turned on to connect the photovoltaic string to the charging/discharging unit 34 (S49). In this state, charging/discharging is performed by the charging/discharging unit 34 until an amount of charges stored in a capacitance relative to a ground of the (i+2)$^{th}$ photovoltaic string 103$_2$ is the same as an amount of charges stored in a capacitance relative to a ground when the negative electrode side is connected to the measuring instrument 33 (S50).

Subsequently, the disconnection switch element 7a is turned on for the (i+1)$^{th}$ photovoltaic string 103$_1$ in the disconnected state to connect the photovoltaic string to the photovoltaic power generation system 100 (S51). Also, S32 to S51 described above are repeated with i=i+2 until the measurement of the voltage drop values V1 and V2 is completed for all the photovoltaic strings 103, and then the photovoltaic string 103 in the disconnected state is connected to the photovoltaic power generation system 100. Then, the process ends Here, as illustrated in the flowchart of FIG. 15, when the voltage drop values V1 and V2 are stored in the storage unit 6 for the photovoltaic string 103, the inter-electrode voltage value and its sign are measured, and the insulation resistance value R$_{leak}$ is calculated using Equation (3) below (S61 and S62).

$$R_{leak}=R_d \times |V0|/(|V1|+|V2|)-R_d \tag{3}$$

Here, R$_d$: Resistance value of the detection resistor 31
V0: Inter-electrode voltage value
V1: Positive electrode voltage drop value
V2: Negative electrode voltage drop value Subsequently, the calculated insulation resistance value R$_{leak}$ and a reference resistance value stored in the storage unit 6 in advance are compared to perform a ground fault determination (S63). Specifically, when the calculated insulation resistance value R$_{leak}$ is equal to or more than the reference resistance value, "no ground fault" is determined, whereas when the insulation resistance value R$_{leak}$ is less than the reference resistance value, "ground fault" is determined.

Also, if a ground fault determination result in S63 described above is "no ground fault," the disconnection switch elements 7a and 7a are turned on for the photovoltaic string 103 which is the measurement target in the disconnected state to connect the photovoltaic string to the photovoltaic power generation system 100, and the measurement switch elements 8a and 8a are turned off to separate the photovoltaic string from the measuring instrument 33 (S64). On the other hand, if the ground fault determination result is "ground fault," the disconnection switch elements 7a and 7a remain in an off state for the photovoltaic string 103 which is the measurement target in the disconnected state to keep the photovoltaic string 103 in the disconnected state, and the measurement switch elements 8a and 8a are turned off to separate the photovoltaic string from the measuring instrument 33 (S65).

As described above, the predetermined measurement can be performed on one photovoltaic string 103 in the disconnected state, and in parallel therewith, the other photovoltaic string 103 which is disconnected and has not yet been subjected to the predetermined measurement can be charged/ discharged in advance in this embodiment as well. Thus, the action effects described above, i.e., action effects of reliably detecting the ground fault and shortening a time required for detection of the ground fault, are achieved.

Particularly, in this embodiment, it is possible to determine whether there is a ground fault by connecting the detection resistor 31 of the measuring instrument 33 to each of the positive electrode side and the negative electrode side of the photovoltaic string 103 in the disconnected state and measuring each of the voltage drop values V1 and V2. Also, the charging/discharging resistor 35 of the charging/discharging unit 34 can be connected to the positive electrode side or the negative electrode side of the other photovoltaic string 103 in the disconnected state to ground and charge/discharge the photovoltaic string, in parallel with any of the measurements of the voltage drop values V1 and V2.

Incidentally, generally, when a zero-phase current is monitored to detect a ground fault, the zero-phase current does not flow when no ground fault is generated and therefore it may be difficult to detect failure of insulation relative to the ground, which causes a current to flow if it comes in contact with a person or the like, in advance. In this regard, in this embodiment, it is possible to suitably detect the failure of insulation relative to the ground in advance since the voltage drop values V1 and V2 are measured and it is determined whether there is a ground fault from the insulation resistance value $R_{leak}$ calculated from the voltage drop values V1 and V2, as described above, instead of monitoring the zero-phase current to detect the ground fault. Further, it is also possible to detect a ground fault point from a balance of the voltage drop values V1 and V2.

Further, in this embodiment, it is possible to detect the insulation resistance value $R_{leak}$ with sufficient precision even in a relatively inexpensive measuring device since the ground fault of the photovoltaic string 103 can be detected only by measuring the first and second voltage drop values V1 and V2 of the detection resistor 31, the inter-electrode voltage value V0, and their signs, as described above.

Further, in this embodiment, it is possible to obtain the insulation resistance value $R_{leak}$ using one detection resistor 31, as described above. On the other hand, when the insulation resistance value $R_{leak}$ is to be obtained using a plurality of detection resistors 31, highly precise calibration for the plurality of detection resistors 31 is necessary. Thus, in this embodiment, the highly precise calibration for the plurality of detection resistors 31 becomes unnecessary, and an error of the insulation resistance value $R_{leak}$ can be easily reduced.

Further, in S61 described above, the inter-electrode voltage value V0 of the disconnected photovoltaic string 103 may be measured in a state in which the measurement switch element 8a on at least one of the positive electrode side and the negative electrode side is turned on, or may be measured in a state in which both are turned off.

Further, in this embodiment, while the configuration in which the voltage drop value of the detection resistor 31 is measured by the voltmeter 32, a configuration in which a current value I1 flowing through the detection resistor 31 when the measurement switch element 8a is connected to the positive electrode side and a current value I2 flowing through the detection resistor 31 when the measurement switch element 8a is connected to the negative electrode side are measured by an ammeter may be adopted. In this case, the calculation control unit 5 may calculate the insulation resistance value $R_{leak}$ using $R_{leak} = V0/(|I1|+|I2|) - R_d$.

Fourth Embodiment

Next, a fourth embodiment of the present invention will be described. Further, differences between the fourth embodiment and the first embodiment will be mainly described in the description of the fourth embodiment.

FIGS. 16 to 19 are schematic configurations illustrating a photovoltaic power generation system including a ground fault detection device according to the fourth embodiment. A ground fault detection device 40 of this embodiment is different from the ground fault detection device 1 described above in that four photovoltaic strings 103 are disconnected at the same time, and a positive electrode-side voltage drop value V1 or a negative electrode-side voltage drop value V2 is measured for the one two photovoltaic strings 103 and, in parallel therewith, the positive electrode side or the negative electrode side of the other two photovoltaic strings 103 is charged/discharged, as illustrated in FIGS. 16 to 19.

In such an embodiment, when a ground fault within the photovoltaic array 101 is detected, four photovoltaic strings 103 among a plurality of photovoltaic strings 103 are sequentially disconnected from the photovoltaic power generation system 100 (a bold frame in FIG. 20), as illustrated in an operation scheme of FIG. 20. In this case, a measuring instrument 3 is connected to a positive electrode side of the photovoltaic string 103 in the disconnected state and a negative electrode side of the other photovoltaic string 103 to measure voltage drop values V1 and V2 of the detection resistors 11 and 12. In parallel therewith, the charging/discharging unit 4 is connected to the positive electrode side of the photovoltaic string 103 which is in the disconnection state and has not yet been measured and the negative electrode side of the other photovoltaic string 103 to charge/discharge the photovoltaic strings.

Further, a photovoltaic array 101 including eight photovoltaic strings 103 is illustrated in FIG. 20. Further, states of the ground fault detection device 40 illustrated in FIGS. 16 to 19 correspond to states when TIME=1 to 4 in FIG. 20, respectively.

Figure 21:
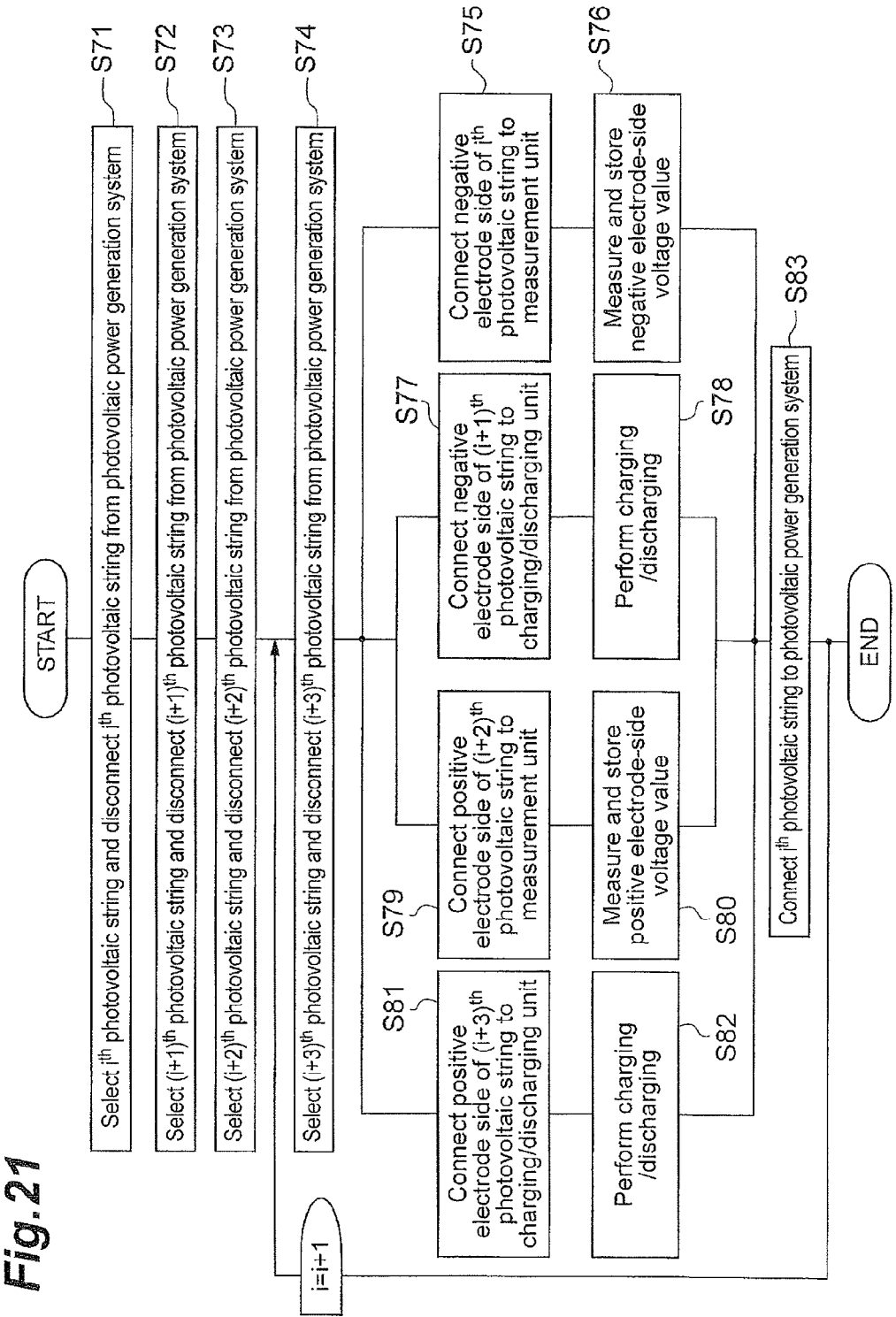
FIG. 21 is a flowchart illustrating operation of the ground fault detection device of FIG. 16.

Next, an example of a ground fault detection method (operation of the ground fault detection program) performed by the ground fault detection device 40 will be illustrated and described with reference to an operation scheme illustrated in FIG. 20 and a flowchart illustrated in FIGS. 21 and 22. In other words, when i is an integer equal to or more than 1, i=i−n when i>n, and an initial value of i is n−2, first, the $i^{th}$ photovoltaic string $103_{n-2}$ is selected and disconnected from the photovoltaic power generation system 100, the $(i+1)^{th}$ photovoltaic string $103_{n-1}$ is selected and disconnected from the photovoltaic power generation system 100, the $(i+2)^{th}$ photovoltaic string $103_n$ is selected and disconnected from the photovoltaic power generation system 100, and the $(i+3)^{th}$ photovoltaic string $103_1$ is selected and disconnected from the photovoltaic power generation system 100, as illustrated in the flowchart of FIG. 21 (see FIG. 16: S71 to S74).

Subsequently, the measurement switch element 8a on the negative electrode side of the $i^{th}$ photovoltaic string $103_{n-2}$ in the disconnected state is turned on to connect the photovoltaic string to the measuring instrument 3, and the measurement switch element 8a on the positive electrode side is turned off to disconnect the photovoltaic string (S75). In this state, the negative electrode-side voltage drop value V2 and its sign of the $i^{th}$ photovoltaic string $103_{n-2}$ are measured by the voltmeter 14, and a result of the measurement is stored in the storage unit 6 (S76).

In parallel with S75 and S76 described above, the charging/discharging switch element 9a on the negative electrode side of the $(i+1)^{th}$ photovoltaic string $103_{n-1}$ in the disconnected state is turned on to connect the photovoltaic string to the charging/discharging unit 4 (S77). In this state, charging/discharging is performed by the charging/discharging unit 4 until an amount of charges stored in a capacitance relative to a ground of the $(i+1)^{th}$ photovoltaic string $103_{n-1}$ is the same as an amount of charges stored in a capacitance relative to a ground when the negative electrode side is connected to the measuring instrument 3 (S78).

In parallel with S75 to S78 described above, the measurement switch element 8a on the positive electrode side of the $(i+2)^{th}$ photovoltaic string $103_n$ in the disconnected state is turned on to connect the photovoltaic string to the measuring instrument 3, and the measurement switch element 8a on the negative electrode side is turned off to disconnect the photovoltaic string (S79). In this state, the positive electrode-side voltage drop value V1 and its sign of the $(i+2)^{th}$ photovoltaic string $103_n$ are measured by the voltmeter 13, and a result of the measurement is stored in the storage unit 6 (S80).

In parallel with S75 to S80 described above, the charging/discharging switch element 9a on the positive electrode side of the $(i+3)^{th}$ photovoltaic string $103_1$ in the disconnected state is turned on to connect the photovoltaic string to the charging/discharging unit 4 (S81). In this state, charging/discharging is performed by the charging/discharging unit 4 until an amount of charges stored in a capacitance relative to a ground of the $(i+3)^{th}$ photovoltaic string $103_1$ is the same as an amount of charges stored in a capacitance relative to a ground when the positive electrode side is connected to the measuring instrument 3 (S82).

Subsequently, the disconnection switch element 7a is turned on for the $i^{th}$ photovoltaic string $103_{n-2}$ in the disconnected state to connect the photovoltaic string to the photovoltaic power generation system 100 (S83). Also, S74 to S83 described above are repeated with i=i+1 until the measurement of the voltage drop values V1 and V2 is completed for all photovoltaic strings 103 (e.g., see FIGS. 17 to 19), and then the photovoltaic string 103 in the disconnected state is connected to the photovoltaic power generation system 100. Then, the process ends.

Figure 22:
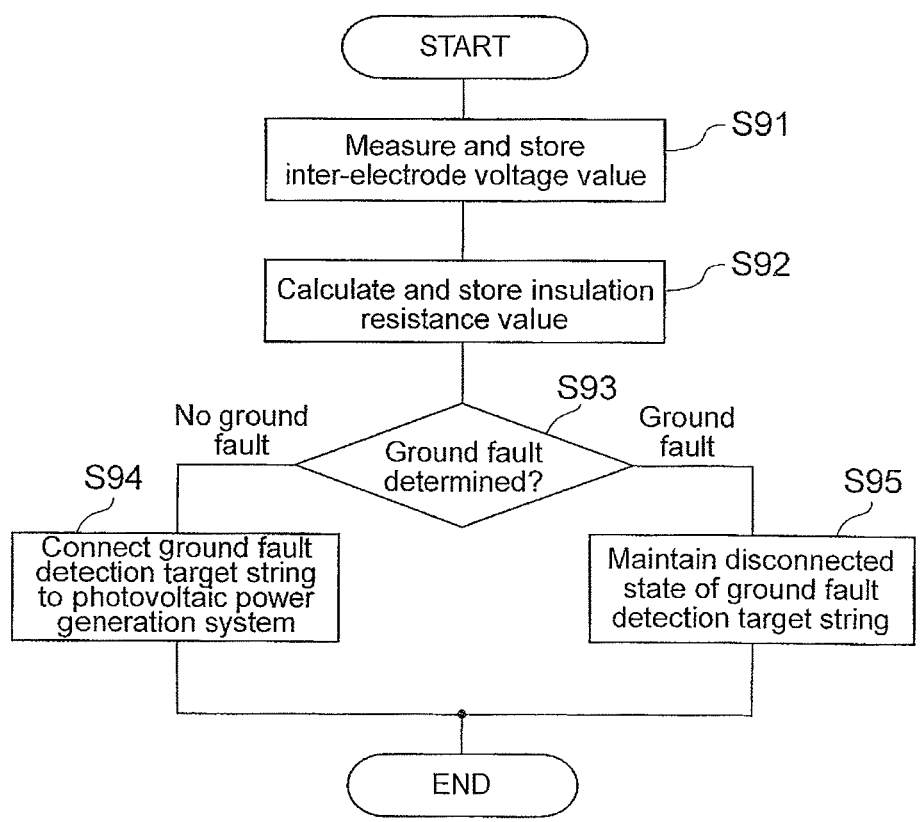
FIG. 22 is a flowchart illustrating another operation of the ground fault detection device of FIG. 16.

Here, as illustrated in the flowchart of FIG. 22, when the voltage drop values V1 and V2 have been stored in the storage unit 6 for the photovoltaic string 103, the inter-electrode voltage value and its sign are also measured to calculate an insulation resistance value $R_{leak}$ (S91 and S92), as in S61 and 62 described above. Also, the ground fault determination is performed (S93), as in S63 described above. When a ground fault determination result is "no ground fault," the photovoltaic string 103 in the disconnected state is connected to the photovoltaic power generation system 100 and separated from the measuring instrument 3 (S94). On the other hand, when the ground fault determination result is "ground fault," the photovoltaic string 103 in the disconnected state remains in a disconnection state and is separated from the measuring instrument 3 (S95).

As described above, the predetermined measurement can be performed on one photovoltaic string 103 in the disconnected state, and in parallel therewith, the other photovoltaic string 103 which is in the disconnected state and has not yet been subjected to the predetermined measurement (the measurement of the voltage drop values V1 and V2) can be charged/discharged in advance in this embodiment as well. Thus, the action effects described above, i.e., action effects of reliably detecting the ground fault and shortening a time required for detection of the ground fault are achieved.

Particularly, in this embodiment, the plurality of photovoltaic strings 103 are charged/discharged in parallel with the measurement for ground fault detection for the plurality of photovoltaic strings 103. Thus, it is possible to further shorten a time required for detection of the ground fault.

While the preferred embodiments of the present invention have been described above, the present invention is not limited to the embodiments and may be changed or applied to other things without departing from the gist defined in each claim.

For example, in the above embodiment, while m which is the number of photovoltaic strings 103 on which the ground fault detection is performed and the number of photovoltaic strings 103 on which charging/discharging is performed is 1, that is, the predetermined measurement necessary for ground fault detection is performed on one measurement target string 103 in the disconnected state, and the one charging/discharging target string 103 in the disconnected state is charged/discharged, the present invention is not limited thereto and it is understood that m is an integer equal to or more than 2.

Further, in the embodiments described above, while the power conditioner 102 is included as the load device, the load device may be a device which consumes or converts power or may be a direct current load, such as a converter or a storage battery. Further, the number of photovoltaic modules 104 constituting each photovoltaic string 103 may be 2 to 7 or may be 9 or more.

Further, in the first and second embodiments, an ammeter may be further included and the above-described leakage current value $I_{leak}$ may be measured by the ammeter to perform ground fault determination. For example, a direct current zero-phase current detector using a Hall element or the like may be used as this ammeter. Further, the number of photovoltaic strings 103 to be disconnected from the photovoltaic power generation system 100 at the same time may be equal to or more than 3 or 5. Further, the number of photovoltaic strings 103 which are measurement targets and the number of photovoltaic strings 103 which are charging/discharging targets may be equal to or more than 3.

Further, in the embodiment, a photovoltaic string group may include a plurality of photovoltaic strings 103, and the photovoltaic array 101 may include a plurality of photovoltaic string groups. In this case, two or more photovoltaic string groups among the plurality of photovoltaic string groups are disconnected from the photovoltaic power generation system 100, the measurement is performed on the m photovoltaic string groups in the disconnected state, and in parallel therewith, m photovoltaic string groups that have not yet been measured in the disconnected state are charged/discharged.

Further, "the same" described above includes substantially the same and allows a variation or an error on manufacture, design or measurement.

Here, in this embodiment, it is desirable for the measurement unit to include first and second detection resistors connected to each other through a connection unit leading to a ground potential, the charging/discharging unit to include first and second charging/discharging resistors connected to each other through a connection unit leading to the ground potential, the first detection resistor and the first charging/discharging resistor to have the same resistance value, and the second detection resistor and the second charging/discharging resistor to have the same resistance value, and the control unit to execute a measurement process for causing the measurement unit to perform a measurement of a measurement value for a voltage value generated in the first and second detection resistors in a state in which a side opposite to the connection unit side in the first detection resistor is connected to a positive electrode side of the disconnected measurement target string and a side opposite to the connection unit in the second detection resistor is connected to a negative electrode side thereof, a charging/discharging process for causing the charging/discharging unit to ground and charge/discharge the charging/discharging target string by connecting a side opposite to the connection unit in the first charging/discharging resistor to a positive electrode side of the disconnected charging/discharging target string, and connecting a side opposite to the connection unit in the second charging/discharging resistor to a negative electrode side thereof, in parallel with the measurement process, and a determination process for determining whether there is a ground fault based on the measured measurement value.

In this case, the measurement value for the value of the current value flowing from the connection unit to the ground potential is monitored, and the charging/discharging target string in the disconnected state can be grounded and charged/discharged in parallel with the predetermined measurement necessary for ground fault detection of the measurement target string in the disconnected state. Further, for example, when the voltage value in the detection resistor is monitored using the voltmeter or the like, the voltage value corresponds to the measurement value, and when the value of the current flowing in the ground potential is monitored using a current sensor or the like, the current value corresponds to the measurement value (the same applies to the following measurement values).

Further, it is desirable for the measurement unit to include at least a measurement direct current power supply having one side connected to a ground potential, the charging/discharging unit to include at least a charging/discharging direct current power supply having one side connected to the ground potential, the other side of the measurement direct current power supply and the other side of the charging/discharging direct current power supply to be connectable to a predetermined point in an electrical path between the individual disconnected photovoltaic string and the load device together, a direct current voltage value to be applied by the measurement direct current power supply and a direct current voltage value to be applied by the charging/discharging direct current power supply to be the same voltage values, and the control unit to execute a measurement process for causing the measurement unit to perform a measurement of a measurement value for a value of a current flowing from the predetermined point to the ground potential in a state in which the other side of the measurement direct current power supply is connected to the predetermined point of the disconnected measurement target string; a charging/discharging process for causing the charging/discharging unit to ground and charge/discharge the charging/discharging target string by connecting the other side of the charging/discharging direct current power supply to the predetermined point of the disconnected charging/discharging target string, in parallel with the measurement process; and a determination process for determining whether there is a ground fault based on the measured measurement value.

In this case, the measurement direct current power supply of the measurement unit can be connected to the measurement target string in the disconnected state, the measurement value for the value of the current (ground fault current) flowing from the predetermined point to the ground potential can be monitored, and it can be determined whether there is a ground fault of the measurement target string, and in parallel therewith, the charging/discharging target string in the disconnected state can be grounded and charged/discharged. Further, in this case, in the predetermined measurement necessary for ground fault detection, the ground fault current can be measured by applying the voltage to the disconnected photovoltaic string using the direct current power supply having one side connected to the ground potential to intentionally change the potential relative to the ground of the photovoltaic string. Further, in this case, since the measurement unit and the charging/discharging unit are connected together to only a predetermined point in the electrical path between the individual disconnected photovoltaic string and the load device, the number of wirings, switches and the like for measuring or charging/discharging the photovoltaic string can be reduced and a circuit configuration can be simplified.

Further, it is desirable for the measurement process to include causing the other side serving as the negative electrode side or the positive electrode side in the measurement direct current power supply to be connected to the positive electrode side or the negative electrode side of the disconnected measurement target string, and the charging/discharging process to include causing the other side serving as the negative electrode side or the positive electrode side in the charging/discharging direct current power supply to be connected to the positive electrode side or the negative electrode side of the disconnected charging/discharging target string.

In this case, an absolute value of the potential relative to the ground of the measurement target string to which measurement direct current power supply is connected can increase or decrease. Therefore, it is possible to increase sensitivity of the ground fault detection.

Further, it is desirable for the measurement unit to include an electrical measurement path having one side connected to a ground potential and the other side connectable to the positive electrode side and the negative electrode side of the plurality of photovoltaic strings, the charging/discharging unit to include an electrical charging/discharging path having one side connected to the ground and the other side connectable to the positive electrode side and the negative electrode side of the plurality of photovoltaic strings, the electrical measurement path and the electrical charging/discharging path to have the same resistance value, the control unit to execute a first measurement process for measuring a measurement value for a value of a current flowing in the electrical measurement path as a first measurement value in a state in which the electrical measurement path is connected to only the positive electrode side of the measurement target string, a second measurement process for measuring a measurement value for a value of a current flowing in the electrical measurement path as a second measurement value in a state in which the electrical measurement path is connected to only the negative electrode side of the measurement target string, a first charging/discharging process for causing the charging/discharging unit to ground and charge/discharge the charging/discharging target string by connecting the electrical charging/discharging path to only the positive electrode side of the charging/discharging target string, a second charging/discharging process for causing the charging/discharging unit to ground and charge/discharge the charging/discharging target string by connecting the electrical charging/discharging path to only the negative electrode side of the charging/discharging target string, and a ground fault determination process for determining whether there is a ground fault based on the first and second measured measurement values, and the first or second measurement process to be executed in parallel with the first or second charging/discharging process.

In this case, it can be determined whether there is a ground fault by connecting the electrical measurement path of the measurement unit to each of the positive electrode side and the negative electrode side of the measurement target string in the disconnected state and measuring the first and second measurement values for the value of a current flowing in the electrical measurement path. Further, in parallel with one of the measurements of the first and second measurement values, the electrical charging/discharging path can be connected to at least one of the positive electrode side and the negative electrode side of the charging/discharging target string in the disconnected state and the at least one can be charged/discharged.

Further, a specific configuration for suitably achieving the action effect of shortening a time required for detection of the ground fault within the photovoltaic array may include a configuration in which the control unit continuously performs the predetermined measurement of the measurement unit without electrically connecting the photovoltaic string to the photovoltaic power generation system after charging/discharging the disconnected photovoltaic string using charging/discharging unit.

INDUSTRIAL APPLICABILITY

The present invention may be applied to a ground fault detection device, a ground fault detection method, a photovoltaic power generation system, and a ground fault detection program, and is capable of reliably detecting the ground fault and shortening the time required for detection of the ground fault.

REFERENCE SIGNS LIST 1, 20, 30, 40 . . . ground fault detection device, 3, 23, 33 . . . measuring instrument (measurement unit), 4, 24, 34 . . . charging/discharging unit (charging/discharging unit), 5 . . . calculation control unit (control unit), 7 . . . disconnection switch (switching unit), 8, 28 . . . measurement switch (measurement unit), 9, 29 . . . charging/discharging switch (charging/discharging unit), 11 . . . first detection resistor, 12 . . . second detection resistor, 16 . . . first charging/discharging resistor, 17 . . . second charging/discharging resistor, 21a, 31 . . . detection resistor, 21b, 35 . . . charging/discharging resistor, 25, 27 . . . measurement direct current power supply, 27 . . . charging/discharging direct current power supply, 100 . . . photovoltaic power generation system, 101 . . . photovoltaic array, 102 . . . power conditioner (load device), 103 . . . photovoltaic string, 104 . . . photovoltaic module, 130 . . . electrical path, Dj . . . electrical charging/discharging path, Ds . . . electrical measurement path, G . . . ground potential, Q . . . predetermined point, V1 . . . positive electrode-side voltage drop value (first voltage drop value), V2 . . . negative electrode-side voltage drop value (second voltage drop value), X1, X2 . . . connection point (connection unit).

The invention claimed is:

1. A ground fault detection device which detects a ground fault within a photovoltaic array in a photovoltaic power generation system comprising:
photovoltaic strings configured in such a manner that a plurality of photovoltaic modules are connected in series;
the photovoltaic array configured in such a manner that the plurality of photovoltaic strings are connected in parallel; and
a load device which consumes or converts power,
wherein the ground fault detection device includes
a switching unit which disconnects two or more photovoltaic strings among the plurality of photovoltaic strings from the photovoltaic power generation system by electrically separating the photovoltaic strings from each other;
a measurement unit which connects to each of the plurality of photovoltaic strings to perform a predetermined measurement;
a charging/discharging unit which connects to each of the plurality of photovoltaic strings and charges/discharges the photovoltaic string so that its potential relative to the ground is the same as the potential relative to the ground when the photovoltaic string is connected to the measurement unit; and
a control unit which performs at least control of operation of the measurement unit and the charging/discharging unit, and the ground fault detection based on a measurement value of the measurement unit, and
the control unit
causes the measurement unit to perform the predetermined measurement on one photovoltaic string among the two or more photovoltaic strings disconnected by the switching unit, as a measurement target string, and in parallel therewith,
causes the charging/discharging unit to charge/discharge the other photovoltaic strings which are separate from the measurement target string and have not yet been subjected to the predetermined measurement among the two or more photovoltaic strings disconnected by the switching unit, as charging/discharging target strings.

2. The ground fault detection device according to claim 1, wherein:
the measurement unit includes first and second detection resistors connected to each other through a connection unit leading to a ground potential,
the charging/discharging unit includes first and second charging/discharging resistors connected to each other through a connection unit leading to the ground potential,
the first detection resistor and the first charging/discharging resistor have the same resistance value, and the second detection resistor and the second charging/discharging resistor have the same resistance value, and
the control unit executes
a measurement process for causing the measurement unit to perform a measurement of a measurement value for a value of a current flowing from the connection unit to the ground potential in a state in which a side opposite to the connection unit side in the first detection resistor is connected to a positive electrode side of the disconnected measurement target string and a side opposite to the connection unit in the second detection resistor is connected to a negative electrode side thereof,
a charging/discharging process for causing the charging/discharging unit to ground and charge/discharge the charging/discharging target string by connecting a side opposite to the connection unit in the first charging/discharging resistor to a positive electrode side of the disconnected charging/discharging target string, and connecting a side opposite to the connection unit in the second charging/discharging resistor to a negative electrode side thereof, in parallel with the measurement process, and
a determination process for determining whether there is a ground fault based on the measured measurement value.

3. The ground fault detection device according to claim 2, wherein, after the control unit causes charging/discharging of the charging/discharging unit to be performed on the disconnected photovoltaic string, the control unit continuously causes the predetermined measurement of the measurement unit to be performed without electrically connecting the disconnected photovoltaic string to the photovoltaic power generation system.

4. The ground fault detection device according to claim 1, wherein:
the measurement unit includes at least a measurement direct current power supply having one side connected to a ground potential,
the charging/discharging unit includes at least a charging/discharging direct current power supply having one side connected to the ground potential,
the other side of the measurement direct current power supply and the other side of the charging/discharging direct current power supply are connectable to a predetermined point in an electrical path between the individual disconnected photovoltaic string and the load device together,
a direct current voltage value to be applied by the measurement direct current power supply and a direct current voltage value to be applied by the charging/discharging direct current power supply are the same voltage values, and
the control unit executes
a measurement process for causing the measurement unit to perform a measurement of a measurement value for a value of a current flowing from the predetermined point to the ground potential in a state in which the other side of the measurement direct current power supply is connected to the predetermined point of the disconnected measurement target string;
a charging/discharging process for causing the charging/discharging unit to ground and charge/discharge the charging/discharging target string by connecting the other side of the charging/discharging direct current power supply to the predetermined point of the disconnected charging/discharging target string, in parallel with the measurement process; and
a determination process for determining whether there is a ground fault based on the measured measurement value.

5. The ground fault detection device according to claim 4, wherein:
the measurement process includes causing the other side serving as the negative electrode side or the positive electrode side in the measurement direct current power supply to be connected to the positive electrode side or the negative electrode side of the disconnected measurement target string, and
the charging/discharging process includes causing the other side serving as the negative electrode side or the positive electrode side in the charging/discharging direct current power supply to be connected to the positive electrode side or the negative electrode side of the disconnected charging/discharging target string.

6. The ground fault detection device according to claim 5, wherein, after the control unit causes charging/discharging of the charging/discharging unit to be performed on the disconnected photovoltaic string, the control unit continuously causes the predetermined measurement of the measurement unit to be performed without electrically connecting the disconnected photovoltaic string to the photovoltaic power generation system.

7. The ground fault detection device according to claim 4, wherein, after the control unit causes charging/discharging of the charging/discharging unit to be performed on the disconnected photovoltaic string, the control unit continuously causes the predetermined measurement of the measurement unit to be performed without electrically connecting the disconnected photovoltaic string to the photovoltaic power generation system.

8. The ground fault detection device according to claim 1, wherein:
the measurement unit includes an electrical measurement path having one side connected to a ground potential and the other side connectable to the positive electrode side and the negative electrode side of the plurality of photovoltaic strings,
the charging/discharging unit includes an electrical charging/discharging path having one side connected to the ground and the other side connectable to the positive electrode side and the negative electrode side of the plurality of photovoltaic strings,
the electrical measurement path and the electrical charging/discharging path have the same resistance value,
the control unit executes
a first measurement process for measuring a measurement value for a value of a current flowing in the electrical measurement path as a first measurement value in a state in which the electrical measurement path is connected to only the positive electrode side of the measurement target string,
a second measurement process for measuring a measurement value for a value of a current flowing in the electrical measurement path as a second measurement value in a state in which the electrical measurement path is connected to only the negative electrode side of the measurement target string,
a first charging/discharging process for causing the charging/discharging unit to ground and charge/discharge the charging/discharging target string by connecting the electrical charging/discharging path to only the positive electrode side of the charging/discharging target string,
a second charging/discharging process for causing the charging/discharging unit to ground and charge/discharge the charging/discharging target string by connecting the electrical charging/discharging path to only the negative electrode side of the charging/discharging target string, and
a ground fault determination process for determining whether there is a ground fault based on the first and second measured measurement values, and
the first or second measurement process is executed in parallel with the first or second charging/discharging process.

9. The ground fault detection device according to claim 8, wherein, after the control unit causes charging/discharging of the charging/discharging unit to be performed on the disconnected photovoltaic string, the control unit continuously causes the predetermined measurement of the measurement unit to be performed without electrically connecting the disconnected photovoltaic string to the photovoltaic power generation system.

10. The ground fault detection device according to claim 1, wherein, after the control unit causes charging/discharging of the charging/discharging unit to be performed on the disconnected photovoltaic string, the control unit continuously causes the predetermined measurement of the measurement unit to be performed without electrically connecting the disconnected photovoltaic string to the photovoltaic power generation system.

11. A photovoltaic power generation system comprising:
photovoltaic strings configured in such a manner that a plurality of photovoltaic modules are connected in series;
a photovoltaic array configured in such a manner that the plurality of photovoltaic strings are connected in parallel;

a load device which consumes or converts power; and the ground fault detection device according to claim 1.

12. A ground fault detection method for detecting a ground fault within a photovoltaic array in a photovoltaic power generation system comprising photovoltaic strings configured in such a manner that a plurality of photovoltaic modules are connected in series;

the photovoltaic array configured in such a manner that the plurality of photovoltaic strings are connected in parallel; and a load device which consumes or converts power, wherein the ground fault method includes:

a disconnection step of disconnecting two or more photovoltaic strings among the plurality of photovoltaic strings from the photovoltaic power generation system by electrically separating the photovoltaic strings from each other;

a measurement step of connecting a measurement unit to each of the plurality of photovoltaic strings to perform a predetermined measurement;

a charging/discharging step of connecting to and charging/discharging each of the plurality of photovoltaic strings so that its potential relative to the ground is the same as the potential relative to the ground when the photovoltaic string is connected to the measurement unit; and a ground fault detection step of determining whether there is a ground fault based on a measurement value obtained in the measurement step, the measurement step includes performing the predetermined measurement on one photovoltaic string among the two or more photovoltaic strings disconnected in the disconnection step, as a measurement target string, and the charging/discharging step includes charging/discharging the other photovoltaic strings which are separate from the measurement target string and have not yet been subjected to the predetermined measurement among the two or more photovoltaic strings disconnected in the disconnection step, as charging/discharging target strings, in parallel with the measurement of the measurement target string in the measurement step.

13. A ground fault detection program for detecting a ground fault within a photovoltaic array in a photovoltaic power generation system comprising photovoltaic strings configured in such a manner that a plurality of photovoltaic modules are connected in series;

the photovoltaic array configured in such a manner that the plurality of photovoltaic strings are connected in parallel; and a load device which consumes or converts power, wherein the ground fault detection program causes a computer to execute:

a disconnection function for disconnecting two or more photovoltaic strings among the plurality of photovoltaic strings from the photovoltaic power generation system by electrically separating the photovoltaic strings from each other;

a measurement function for connecting a measurement unit to each of the plurality of photovoltaic strings to perform a predetermined measurement;

a charging/discharging function for connecting a charging/discharging unit to each of the plurality of photovoltaic strings and charging/discharging the photovoltaic string so that its potential relative to the ground is the same as the potential relative to the ground when the photovoltaic string is connected to the measurement unit, and a ground fault detection function for determining whether there is a ground fault based on a measurement value obtained through the measurement function, the measurement function includes performing the predetermined measurement on one photovoltaic string among the two or more photovoltaic strings disconnected through the disconnection function, as a measurement target string, and the charging/discharging function includes charging/discharging the other photovoltaic strings which are separate from the measurement target string and have not yet been subjected to the predetermined measurement among the two or more photovoltaic strings disconnected through the disconnection function, as charging/discharging target strings, in parallel with the measurement of the measurement target string through the measurement function.

* * * * *